United States Patent
Nishimura et al.

(10) Patent No.: US 9,488,679 B2
(45) Date of Patent: Nov. 8, 2016

(54) CURRENT SENSOR HAVING A LAMINATED MAGNETIC CORE

(71) Applicant: JAPAN AVIATION ELECTRONICS INDUSTRY, LIMITED, Tokyo (JP)

(72) Inventors: Hisashi Nishimura, Tokyo (JP); Toshikazu Suzuki, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 178 days.

(21) Appl. No.: 14/387,423

(22) PCT Filed: Mar. 29, 2013

(86) PCT No.: PCT/JP2013/059609
§ 371 (c)(1),
(2) Date: Sep. 23, 2014

(87) PCT Pub. No.: WO2013/175865
PCT Pub. Date: Nov. 28, 2013

(65) Prior Publication Data
US 2015/0084621 A1 Mar. 26, 2015

(30) Foreign Application Priority Data

May 25, 2012 (JP) .................................. 2012-120132

(51) Int. Cl.
*G01R 19/00* (2006.01)
*G01R 15/20* (2006.01)
*G01R 33/07* (2006.01)

(52) U.S. Cl.
CPC .......... *G01R 19/0092* (2013.01); *G01R 15/202* (2013.01); *G01R 15/207* (2013.01); *G01R 33/072* (2013.01)

(58) Field of Classification Search
CPC .......... G01R 1/20; G01R 1/22; G01R 11/06; G01R 19/20; G01R 33/0283; G01R 15/20; G01R 21/08; G01R 33/075; G01R 1/203; G01R 15/146; G01R 19/0007; G01R 15/202; G01R 19/0092; G01R 15/207; G01R 33/072; G05G 2009/04755; G06G 7/162

USPC ................................................. 324/116–126
See application file for complete search history.

(56) References Cited

U.S. PATENT DOCUMENTS

| | | | | |
|---|---|---|---|---|
| 2,464,807 A | * | 3/1949 | Hansen, Jr. .......... | G01R 15/202 257/421 |
| 6,348,800 B1 | * | 2/2002 | Haensgen ............ | G01R 31/024 324/117 H |
| 2009/0128129 A1 | * | 5/2009 | Aratani ................ | G01R 15/207 324/117 H |
| 2014/0239946 A1 | | 8/2014 | Suzuki | |

FOREIGN PATENT DOCUMENTS

| | | |
|---|---|---|
| JP | H5-275255 A | 10/1993 |
| JP | H6-18977 U | 3/1994 |
| JP | 2008-224488 A | 9/2008 |

OTHER PUBLICATIONS

International Search Report, mailed Jul. 9, 2013 for Patent Application No. PCT/JP2013/ 59609.

* cited by examiner

*Primary Examiner* — Jay Patidar
(74) *Attorney, Agent, or Firm* — Greenblum & Bernstein, P.L.C.

(57) ABSTRACT

A current sensor includes a magnetic core with a gap in part of a circumference and formed in an annular shape, and a magneto-electric conversion element arranged in the gap, the magneto-electric conversion element detecting magnetic fluxes changing with a measurement target current passing through a hollow part of the magnetic core. The magnetic core is formed by laminating a plurality of materials in a direction except a circumferential direction, and is formed so that magnetic flux densities of two points in an area defined in advance as an area where a sensing part of the magneto-electric conversion element can exist (hereinafter referred to as a sensing part existence area) approximate to each other, the two points being away from each other with a distance in a laminating direction being a length of the sensing part in the laminating direction.

9 Claims, 21 Drawing Sheets

--PRIOR ART--   HALL ELEMENT SENSING PART

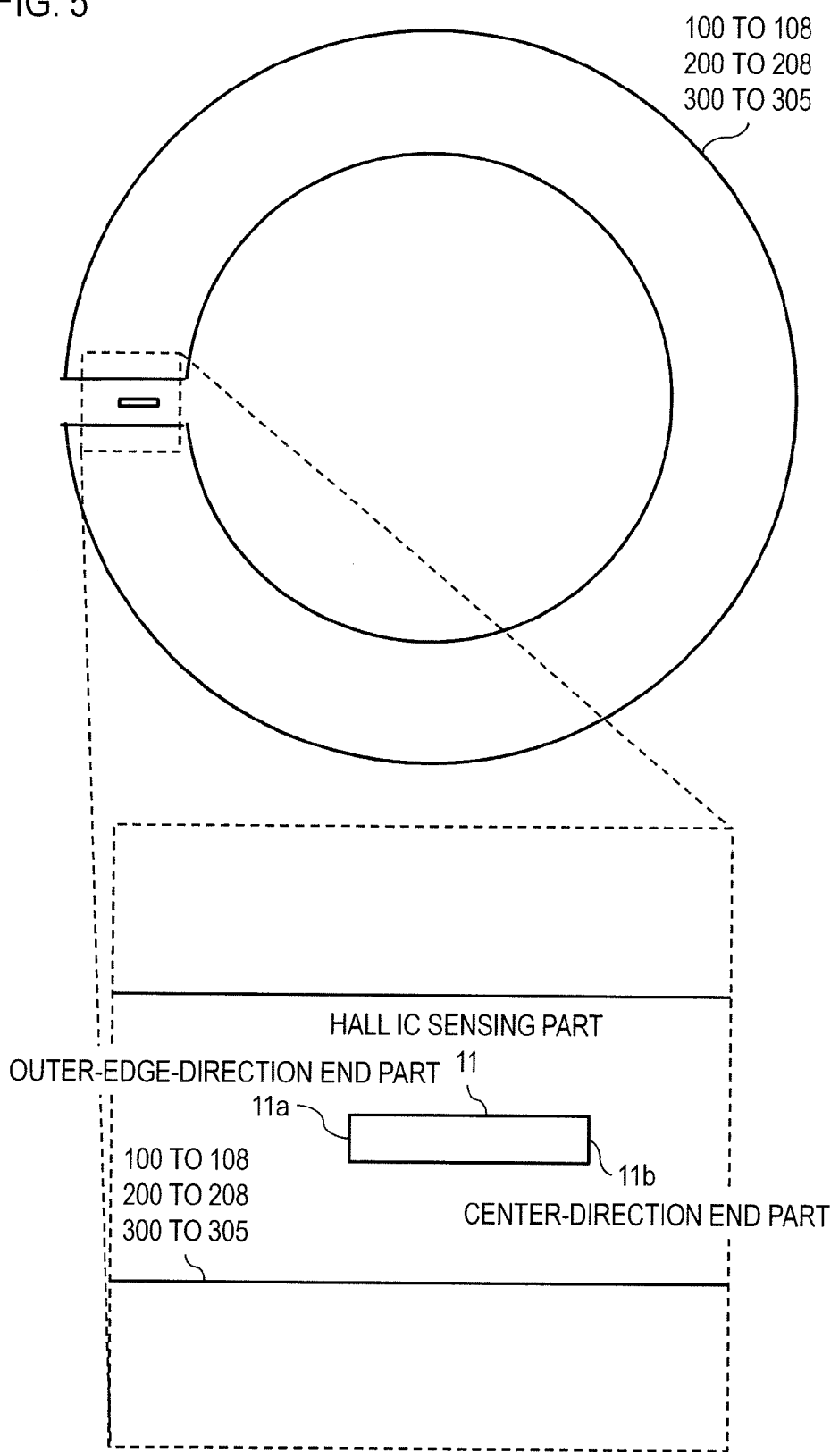

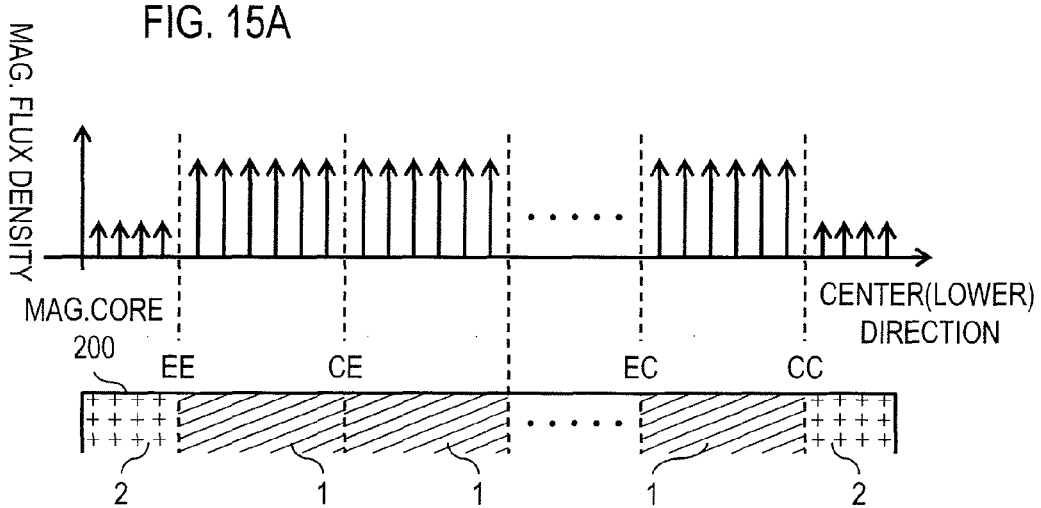
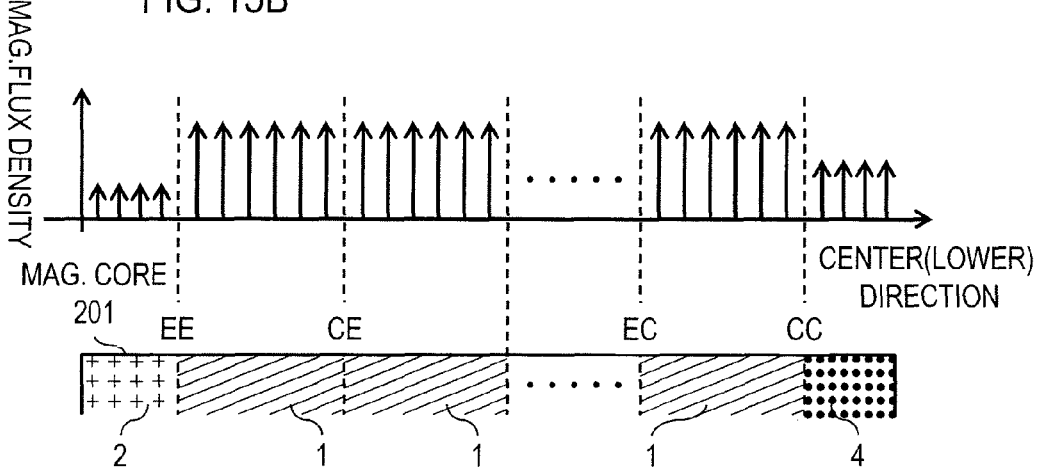
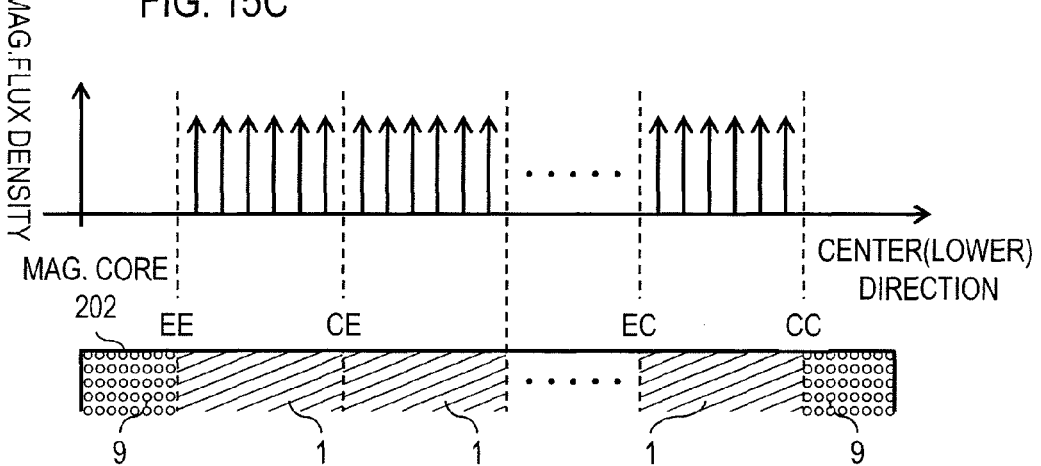

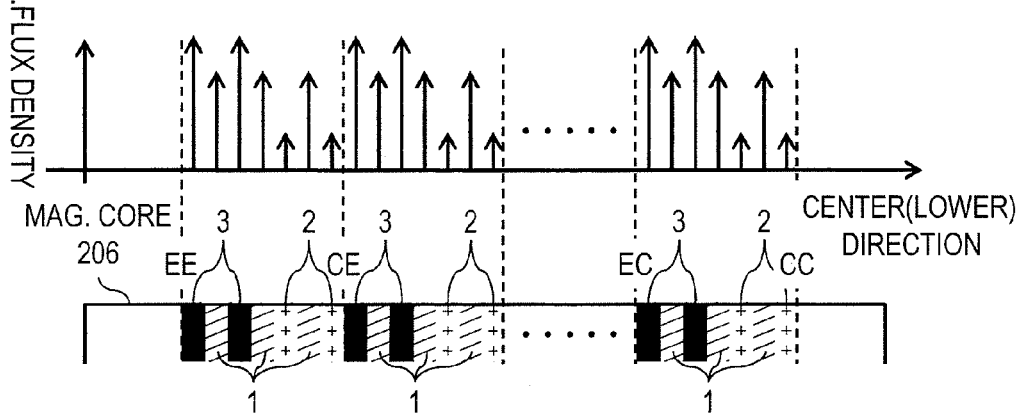
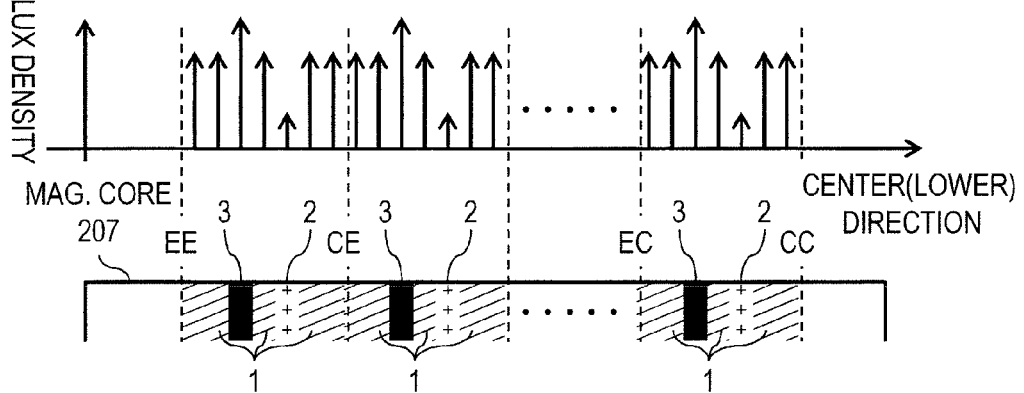
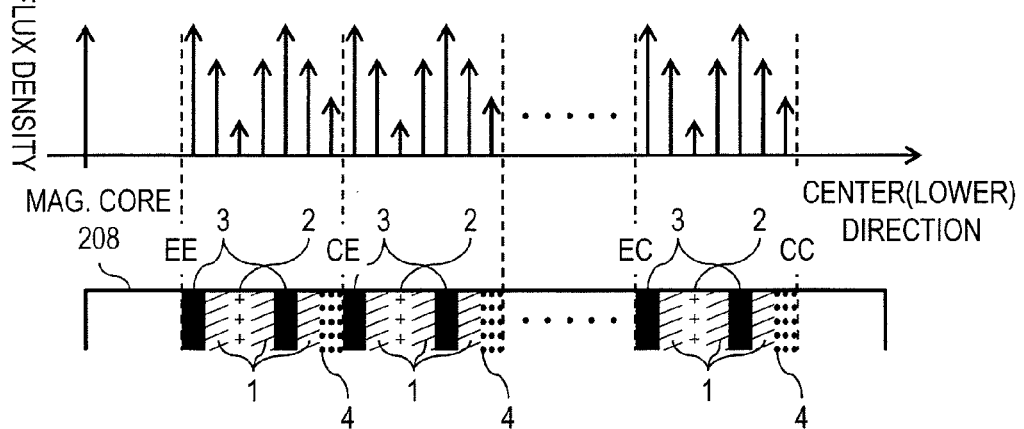

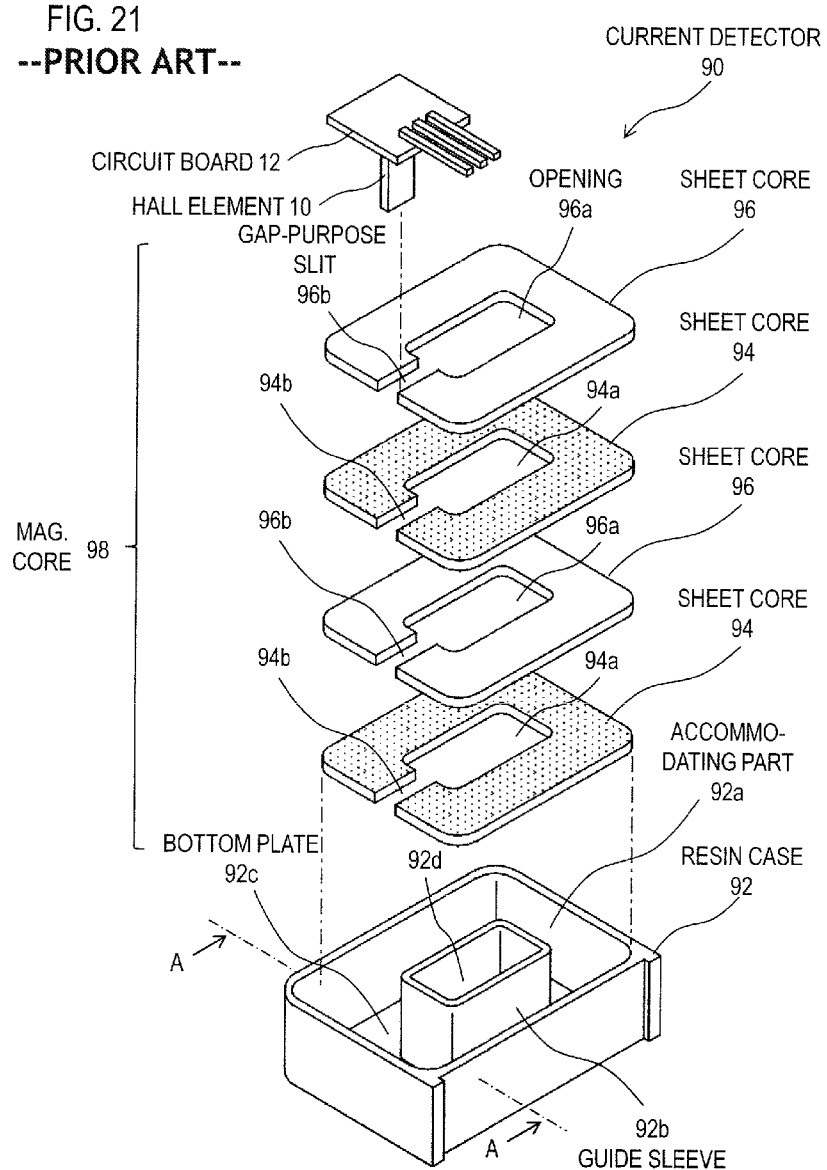

CURRENT SENSOR HAVING A LAMINATED MAGNETIC CORE

TECHNICAL FIELD

The present invention relates to a current sensor of a magnetic proportion type or magnetic balance type for use in measuring and detecting current.

BACKGROUND ART

As a prior technology regarding a current detector of a magnetic proportional type, an example is disclosed in Patent Literature 1. A current detector of a fifth embodiment of Patent Literature 1 is described with reference to FIG. 21. FIG. 21 is a perspective view illustrating the current sensor of the fifth embodiment of Patent Literature 1 in an exploded manner.

A current detector 90 of the fifth embodiment of Patent Literature 1 includes a resin case 92. In the resin case 92, plate-shaped sheet cores 94 and 96 are accommodated as being stacked in plural. These sheet cores 94 and 96 configure one magnetic core 98 as being accommodated in the resin case 92. While two sheet cores 94 and two sheet cores 96 are illustrated in FIG. 21, the actual number of sheets is more, illustration of which are omitted in the drawing.

The sheet cores 94 and 96 are each formed in a substantially-angular C shape, and the above-shaped sheet cores 94 and 96 are formed by punching a plate-shaped magnetic material. Here, the sheet cores 94 and 96 have openings 94a and 96a, respectively, at the center position, and gap-purpose slits 94b and 96b extending from the openings 94a and 96a, respectively, are formed toward one side edge. The openings 94a and 96a are each formed in a substantially square shape, matching the outer shape of each of the sheet cores 94 and 96, respectively.

When the sheet cores 94 and 96 are accommodated as being stacked inside the resin case 92, the openings 94a and 96a and the gap-purpose slits 94b and 96b mutually match each other when viewed in a stacking direction. Thus, with many sheet cores 94 and 96 configuring one magnetic core 98, a successive through hole is formed at the center position, and a core gap is formed in part of the circumferential direction.

Inside the resin case 92, an accommodating part 92a and a guide sleeve 92b are formed. The accommodating part 92a has an upper portion illustrated in FIG. 21 open and a bottom plate 92c formed therebelow. The guide sleeve 92b extends upward from above the bottom plate 92c, and has its inside formed as a hollow current conductive part 92d. The outer shape of the guide sleeve 92b is slightly smaller than each of the openings 94a and 96a of the sheet cores 94 and 96, and the dimensions inside the accommodating part 92a are larger than the outer shape of each of the sheet cores 94 and 96. Therefore, when the sheet cores 94 and 96 are accommodated inside the resin case 92, each of the openings 94a and 96a is guided along the outer surface of the guide sleeve 92b, thereby making it easy to position the sheet cores 94 and 96 mutually.

Inside the resin case 92, together with the sheet cores 94 and 96, a Hall element 10 is also accommodated. The Hall element 10 is mounted on a circuit board 12, and the circuit board 12 is accommodated so as to be stacked on the upper surface of the sheet core 96 of the outermost layer. Here, the Hall element 10 is inserted through the gap-purpose slits 94b and 96b of the sheet cores 94 and 96, thereby being positioned inside the core gap of the magnetic core 98.

In the fifth embodiment, one sheet core 94 is made of an iron-nickel alloy (for example, PB=45% Permalloy and PC=78% Permalloy) as a material, and the other sheet core 96 is made of a non-oriented silicon steel plate as a material.

In this case, the sheet core 96 is made of a non-oriented silicon steel plate, and has a portion with degraded magnetic characteristics as a core for current detection (in particular, hysteresis width). However, the other sheet core 94 is made of Permalloy, and has excellent magnetic characteristics (output linearity, hysteresis width, and saturation characteristics) as a core for current detection. By stacking these sheet cores 94 and 96 of different magnetic materials to configure the magnetic core 98, a defect unique to the sheet core 96 can be compensated for by another sheet core 94. As a result, favorable magnetic characteristics can be achieved in the magnetic core 98 as a whole, and characteristics sufficient as a product can be achieved.

Also in the fifth embodiment, since the non-oriented silicon steel plate of a relatively inexpensive magnetic material and Permalloy of a relatively expensive magnetic material are used in combination, the amount of use of Permalloy with respect to the whole can be suppressed, and it is possible to contribute to saving of material cost accordingly.

PRIOR ART LITERATURE

Patent Literature

Patent literature 1: Japanese Patent Application Laid Open No. 2008-224488

SUMMARY OF THE INVENTION

Problems to be Solved by the Invention

Problems of a current detector using a magnetic core formed by laminating a plurality of material as Patent Literature 1 are described below with reference to FIG. 1. FIG. 1 schematically illustrates the problems of the current detector using a magnetic core formed by laminating a plurality of materials in a conventional technology. FIG. 1A is a schematic view of FIG. 21 along an A-A section, with the Hall element 10 inserted in a core gap of the magnetic core 98. FIG. 1B is a schematic view for describing positional variations of a Hall element sensing part 11 and variations in total number of magnetic fluxes penetrating through the Hall element sensing part 11, the magnetic fluxes occurring due to the positional variations. As illustrated with a broken line in FIG. 1A, inside the Hall element 10, the Hall element sensing part 11 exists, which is an area where a magnetic field occurring from a magnetic core 98 is detected. Here, the Hall element 10 including the Hall element sensing part 11 is roughly positioned, with the circuit board 12 accommodated in an accommodating part 92a and placed on a sheet core of the uppermost stage of the magnetic core 98. Note that the inside of the accommodating part 92a of the resin case 92 is sealed with potting resin not illustrated in the drawing. However, even if the Hall element 10 is roughly positioned in the above-described manner, as illustrated with broken lines in FIG. 1B, positional variations may occur in the position of the Hall element sensing part 11, compared among products. Generally, for simplification of manufacturing processes, a structure of highly accurately positioning the magnetic core and the Hall element is hardly provided. Therefore, when the sheet cores 94 and 96 are made of materials with different magnetic permeabilities, the total number of magnetic fluxes penetrating through the Hall element sensing part 11 varies among products even with the same measurement target current, thereby posing a problem of the occurrence of an error in sensitivity of the current sensor. Moreover, not only variations in position among products but also, for example, addition of vibration to the current sensor body in use may cause fluctuations in position of the Hall element sensing part 11 to change the sensitivity of the current sensor.

Thus, it is an object of the present invention to provide a current sensor capable of suppressing fluctuations in sensitivity due to positional variations of the Hall element even if a magnetic core formed by laminating a plurality of materials is used.

Means to Solve the Problems

The current sensor of the present invention includes a magnetic core with a gap in part of a circumference and formed in an annular shape; and a magneto-electric conversion element arranged in the gap, the magneto-electric conversion element detecting magnetic fluxes changing with a measurement target current passing through a hollow part of the magnetic core. The magnetic core is formed by laminating a plurality of materials in a direction except a circumferential direction, and is formed so that magnetic flux densities of two points in an area defined in advance as an area where a sensing part of the magneto-electric conversion element can exist (hereinafter referred to as a sensing part existence area) approximate to each other, the two points being away from each other with a distance in a laminating direction being a length of the sensing part in the laminating direction.

Also, a length S of the sensing part existence area in the laminating direction may be smaller than twice the length $L_H$ of the sensing part in the laminating direction, and the magnetic core may be formed so that a distribution of magnetic flux densities in the laminating direction in the sensing part existence area has regularity in a cycle of a length $(S-L_H)/m$ (where m is taken as an integer equal to or larger than 1).

Furthermore, a length S of the sensing part existence area in the laminating direction may be equal to or larger than twice the length $L_H$ of the sensing part in the laminating direction, and the magnetic core may be formed so that a distribution of magnetic flux densities in the laminating direction in the sensing part existence area has regularity in a cycle of a length $L_H/m$ (where m is taken as an integer equal to or larger than 1).

Still further, the magnetic core may be formed by irregularly laminating a plurality of materials.

Still further, the magnetic core may be formed with lamination in a concentric annular shape.

Yet still further, the magnetic core may be formed with lamination in a conducting direction of the measurement target current.

Yet still further, the magnetic core may be formed by rolling a flat plate formed by laminating a plurality of different materials into an annular shape and cutting part of the circumference.

Yet still further, the magnetic core may be formed by alternately laminating an oriented electromagnetic steel and an amorphous magnetic alloy.

Yet still further, the magnetic core may be formed by alternately laminating an oriented electromagnetic steel and ferrite.

Effects of the Invention

According to the current sensor of the present invention, fluctuations in sensitivity due to positional variations of a Hall element can be suppressed even when a magnetic core formed by laminating a plurality of materials is used.

BRIEF DESCRIPTION OF THE DRAWINGS

FIG. 5 is a diagram schematically illustrating a relation in position between a magnetic core and a Hall IC sensing part included in the current sensor according to the embodiments of the present invention (plan view).

FIG. 15A is a schematic diagram illustrating a tenth application example adoptable for the current sensor of the second embodiment.

FIG. 15B is a schematic diagram illustrating an eleventh application example adoptable for the current sensor of the second embodiment.

FIG. 15C is a schematic diagram illustrating a twelfth application example adoptable for the current sensor of the second embodiment.

FIG. 17A is a schematic diagram illustrating a sixteenth application example adoptable for the current sensor of the second embodiment.

FIG. 17B is a schematic diagram illustrating a seventeenth application example adoptable for the current sensor of the second embodiment.

FIG. 17C is a schematic diagram illustrating an eighteenth application example adoptable for the current sensor of the second embodiment.

FIG. 21 is a perspective view illustrating a current sensor of a fifth embodiment of Patent Literature 1 in an exploded manner.

DETAILED DESCRIPTION OF THE EMBODIMENTS

Embodiments of the present invention are described in detail below. Note that components having the same function are provided with the same numeral, and redundant description is omitted.

Figure 1A:
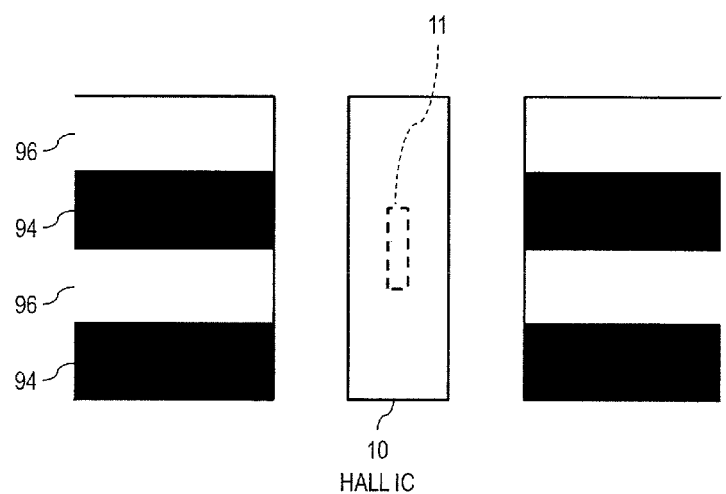
FIG. 1A is a schematic view of FIG. 21 along an A-A section, with a Hall element inserted in a core gap of a magnetic core.
Figure 1B:
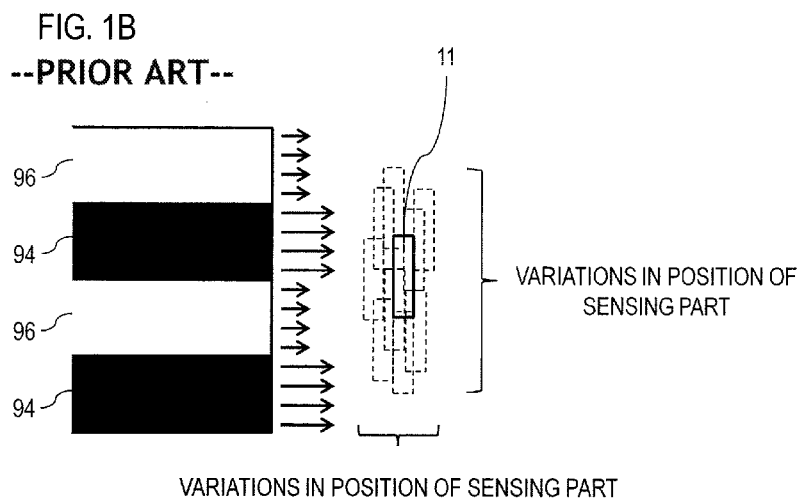
FIG. 1B is a schematic view for describing positional variations of a Hall element sensing part and variations in total number of magnetic fluxes penetrating through the Hall element sensing part, the magnetic fluxes occurring due to the positional variations.
Figure 2:
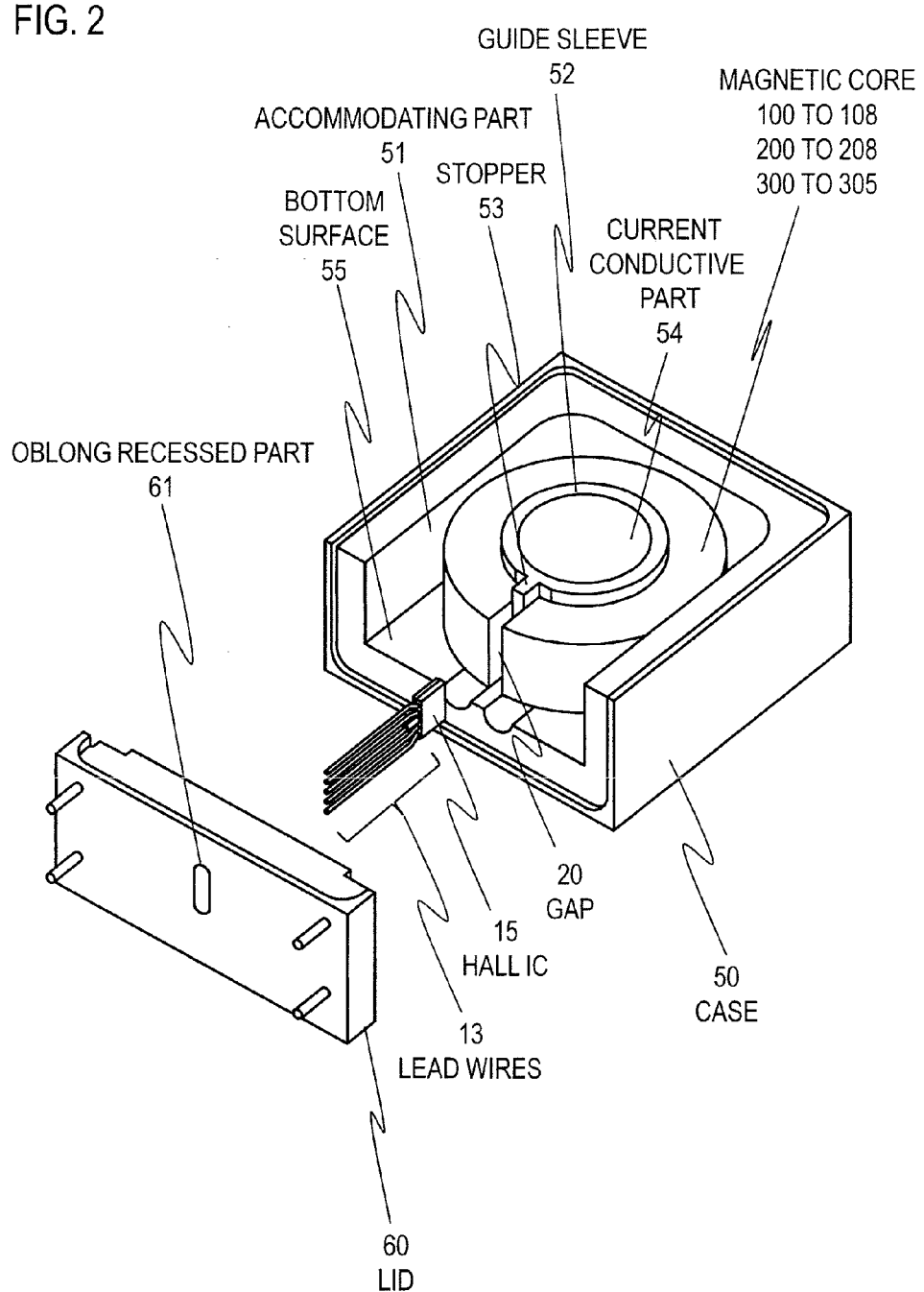
FIG. 2 is an exploded perspective view of main components of the current sensor according to embodiments of the present invention.
Figure 3:
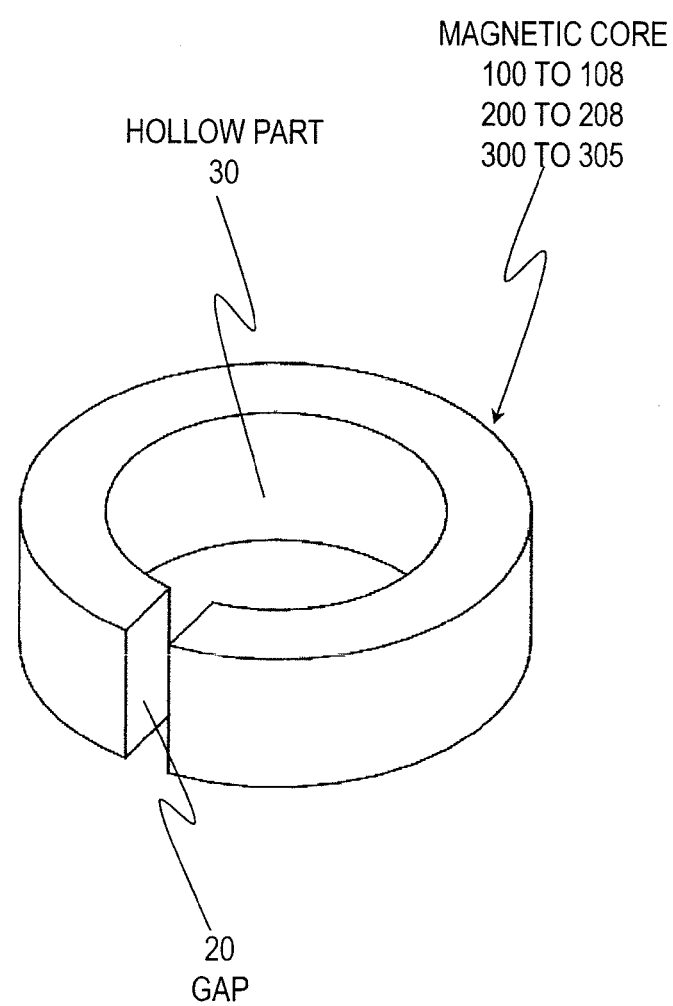
FIG. 3 is a perspective view of a magnetic core included in the current sensor according to the embodiments of the present invention.
Figure 4A:
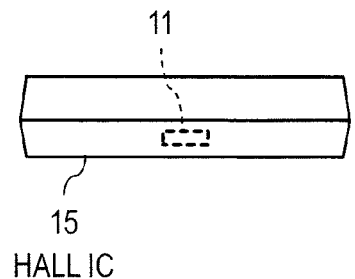
FIG. 4A is a plan view of a Hall IC included in the current sensor according to the embodiments of the present invention.
Figure 4B:
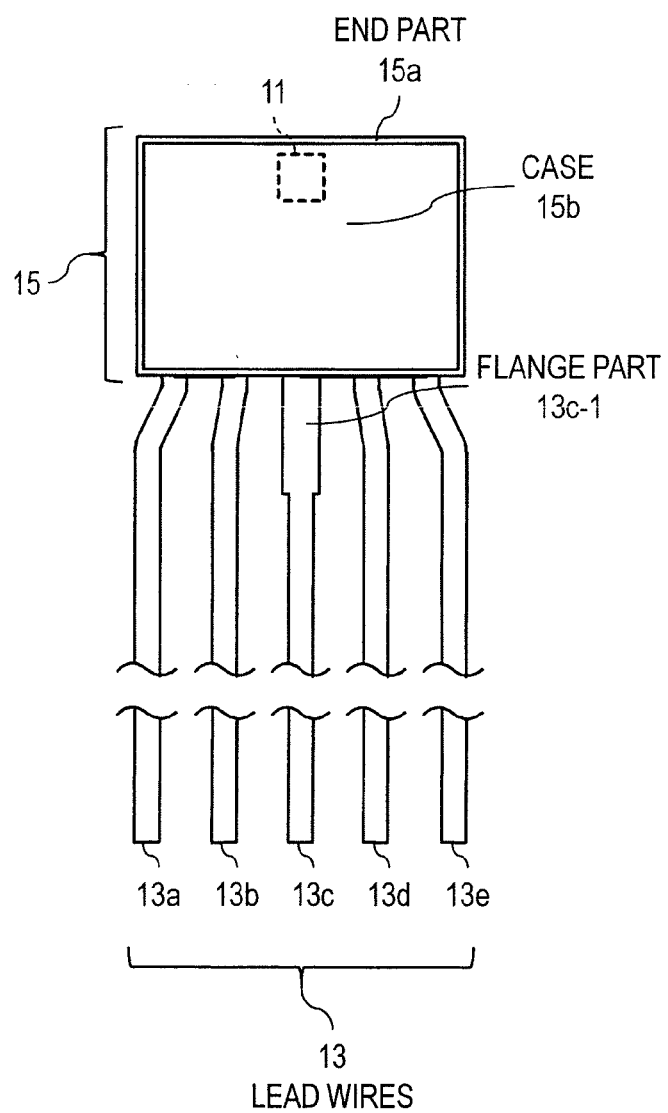
FIG. 4B is a front view of the Hall IC included in the current sensor according to the embodiments of the present invention.
Figure 4C:
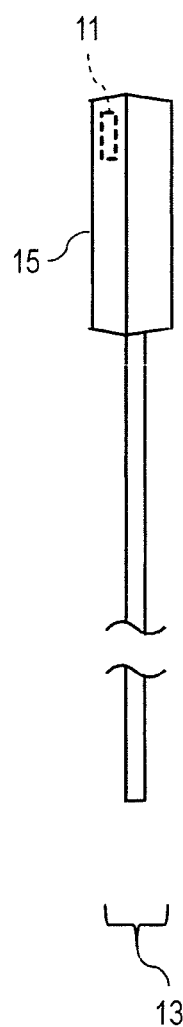
FIG. 4C is a right side view of Hall IC included in the current sensor according to the embodiments of the present invention.

The structure of a current sensor according to the embodiments of the present invention is described below with reference to FIGS. 2, 3, and 4. FIG. 2 is an exploded perspective view of main components of the current sensor according to embodiments of the present invention. FIG. 3 is a perspective view of a magnetic core included in the current sensor according to the embodiments of the present invention. FIG. 4 is an orthographic projection view of a Hall IC included in the current sensor according to the embodiments of the present invention, of which FIG. 4A is a plan view, FIG. 4B is a front view, and FIG. 4C is a right side view.

The current sensor according to the embodiments of the present invention is a device which detects a current flowing through a bus bar, cable, or the like which electrically connects a battery and a device such as a motor in a vehicle such as an electric automobile or hybrid automobile. As illustrated in FIG. 2, the current sensor according to the embodiments of the present invention includes a magnetic core 100 (101 to 108, 200 to 208, 300 to 305; any of these reference numerals is used depending on the relevant one of the embodiments described further below), a Hall IC 15, lead wires 13 connected to the Hall IC 15, a case 50, and a lid 60.

<Magnetic Core>

The magnetic core 100 (101 to 108, 200 to 208, 300 to 305) of the present invention is formed by laminating soft magnetic materials (materials with a small coercive force and high magnetic permeability, for example, iron, silicon steel, Permalloy, Sendust, Pennendur, soft ferrite, amorphous magnetic alloy, nanocrystalline magnetic alloy, and electromagnetic steel) of a plurality of types. Examples of the electromagnetic steel include a non-oriented steel plate not magnetizing with bias toward a specific direction and an oriented steel plate which tends to magnetize only in a specific direction. The laminating direction of the plurality of materials can be any direction except a circumferential direction of the core. Also, the number of types of materials may be two, three, or any as long as the number is two or more. Furthermore, the plurality of materials may be laminated irregularly. Details will be described further below.

<Hall IC (Magneto-Electric Conversion Element)>

The Hall IC 15 included in the current sensor of the present invention detects magnetic fluxes varying with a measurement target current flowing through the bus bar, cable, or the like inserted into a hollow part 30 of the magnetic core 100 (101 to 108, 200 to 208, 300 to 305), and outputs a magnetic flux detection signal as an electrical signal. The Hall IC 15 is connected to an external circuit not illustrated in the drawing via lead wires 13. In the present invention, the Hall IC 15 may be embodied by a combination of a Hall element and an electrical circuit. The Hall IC 15 and the Hall element are examples of a magneto-electric conversion element.

The case 50 is in a box shape of a rectangular parallelepiped, with its upper surface and one side surface open. A cylindrical guide sleeve 52 is provided so as to penetrate through a bottom surface 55 of the case 50, and the bus bar, cable, or the like not illustrated in the drawing can be inserted into an inner cavity (a current conductive part 54) of the guide sleeve 52. On an outer side surface of the guide sleeve 52 adjacent to the opening of the side surface of the case 50, a stopper 53 is formed, which is a plate-shaped protrusion perpendicular to the outer side surface. An area surrounded by the inner wall of the case 50 and the outer side surface of the guide sleeve 52 is referred to as an accommodating part 51. As illustrated in FIG. 3, the magnetic core 100 (101 to 108, 200 to 208, 300 to 305) has a gap 20 in part of its circumference and formed in an annular shape. The magnetic core 100 (101 to 108, 200 to 208, 300 to 305) is formed by rolling a plate-shaped material in a longitudinal direction into an annular shape so as to surround the hollow part 30, with both ends in the longitudinal direction facing each other via the gap 20.

The outer shape of the guide sleeve 52 is slightly smaller than a hollow part 30 of the magnetic core 100 (101 to 108, 200 to 208, 300 to 305). Also, the width of the stopper 53 in a circumferential direction of the guide sleeve 52 is slightly smaller than the width of the gap 20 in a core circumferential direction. Furthermore, the dimensions of the inner side of the accommodating part 51 are larger than the outer shape of the magnetic core 100 (101 to 108, 200 to 208, 300 to 305). Thus, to accommodate the magnetic core 100 (101 to 108, 200 to 208, 300 to 305) inside the case 50, the hollow part 30 and the gap 20 are guided along the outer surfaces of the guide sleeve 52 and the stopper 53, the magnetic core 100 (101 to 108, 200 to 208, 300 to 305) is mounted on the bottom surface 55. With this, the magnetic core 100 (101 to 108, 200 to 208, 300 to 305) is roughly positioned.

An oblong recessed part 61 elongated in a vertical lower direction is provided approximately at the center of the outer surface of the lid 60. Inside the oblong recessed part 61, five lead wire holes not illustrated in the drawing are provided in one line in a vertical direction. On the other hand, as illustrated in FIG. 4, the Hall IC 15 is configured of a case 15b in a shape of a rectangular parallelepiped, a circuit board for magneto-electric conversion not illustrated in the drawing inside the case 15b, and a Hall IC sensing part 11 (its position is roughly illustrated with a broken line). At a lower end of the Hall IC 15, five lead wires 13 (13a, 13b, 13c, 13d, and 13e) are provided. The lead wires 13 are inserted into the lead wire holes provided to the oblong recessed part 61 of the lid 60. Here, among the five lead wires 13, the center lead wire 13c is provided with a flange part 13c-1 formed by making a portion of the lead wire 13c thick in a flange shape. With the flange part 13c-1 filling the lead wire hole, the Hall IC 15 is held with respect to the lid 60. The lid 60 is mounted on the opening of the side surface of the case 50. Here, an end part 15a opposite to the end part provided with the lead wires 13 of the Hall IC 15 makes contact with the stopper 53 to be roughly positioned.

Figure 6:
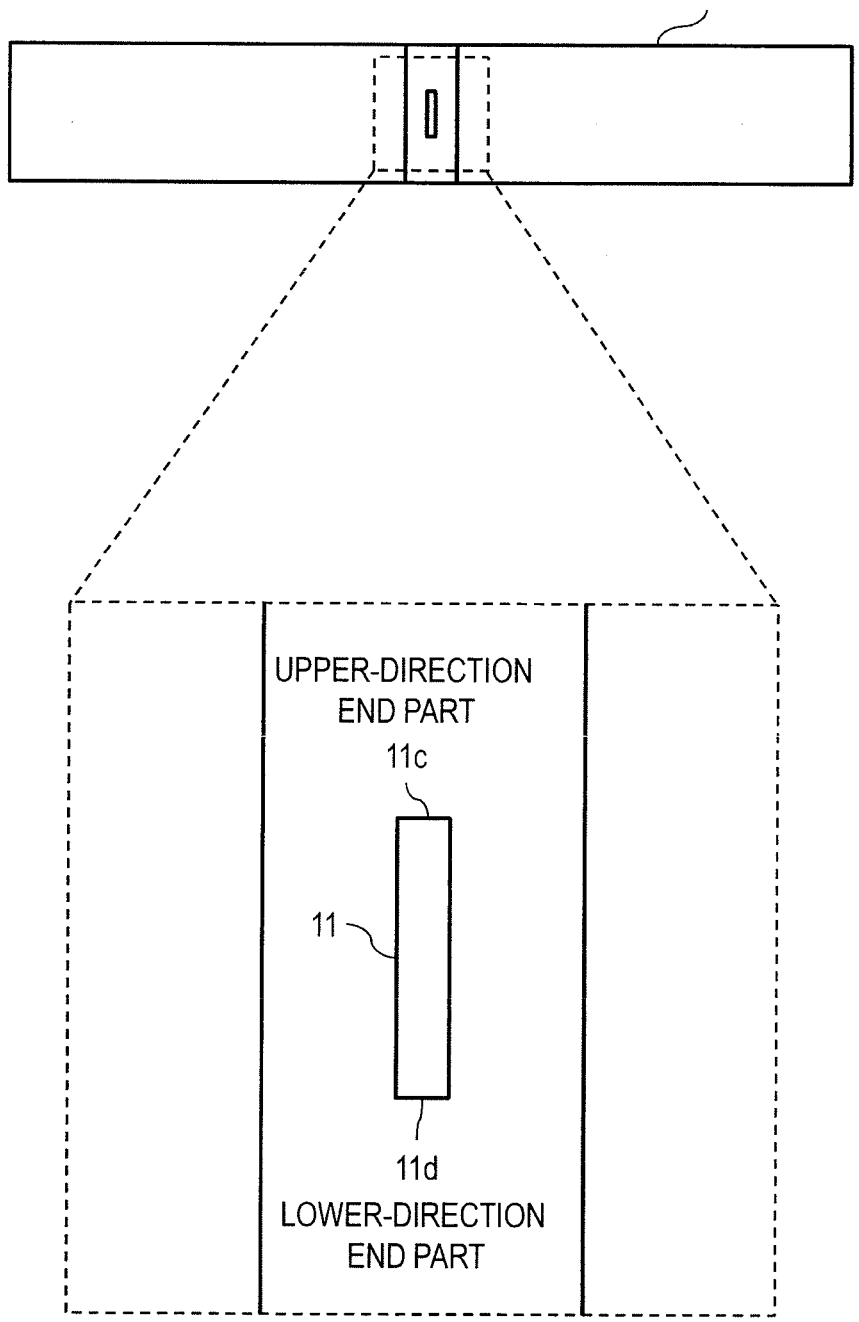
FIG. 6 is a diagram schematically illustrating the relation in position between the magnetic core and the Hall IC sensing part included in the current sensor according to the embodiments of the present invention (front view).

A positional relation between the magnetic core 100 (101 to 108, 200 to 208, 300 to 305) and the Hall IC sensing part 11 is described below with reference to FIG. 5 and FIG. 6. FIG. 5 is a diagram schematically illustrating a relation in position between the magnetic core and the Hall IC sensing part included in the current sensor according to the embodiments of the present invention (plan view). FIG. 6 is a diagram schematically illustrating the relation in position between the magnetic core and the Hall IC sensing part included in the current sensor according to the embodiments of the present invention (front view). As illustrated in FIG. 5, an end part of the Hall IC sensing part 11 in an outer edge direction of the core is referred to as an outer-edge-direction end part 11a, and an end part of the Hall IC sensing part 11 in a center direction of the core is referred to as a center-direction end part 11b. Also as illustrated in FIG. 6, an end part of the Hall IC sensing part 11 in a upper surface direction of the core is referred to as an upper-direction end part 11c, and an end part of the Hall IC sensing part 11 in a lower surface direction of the core is referred to as a lower-direction end part 11d.

Figure 7:
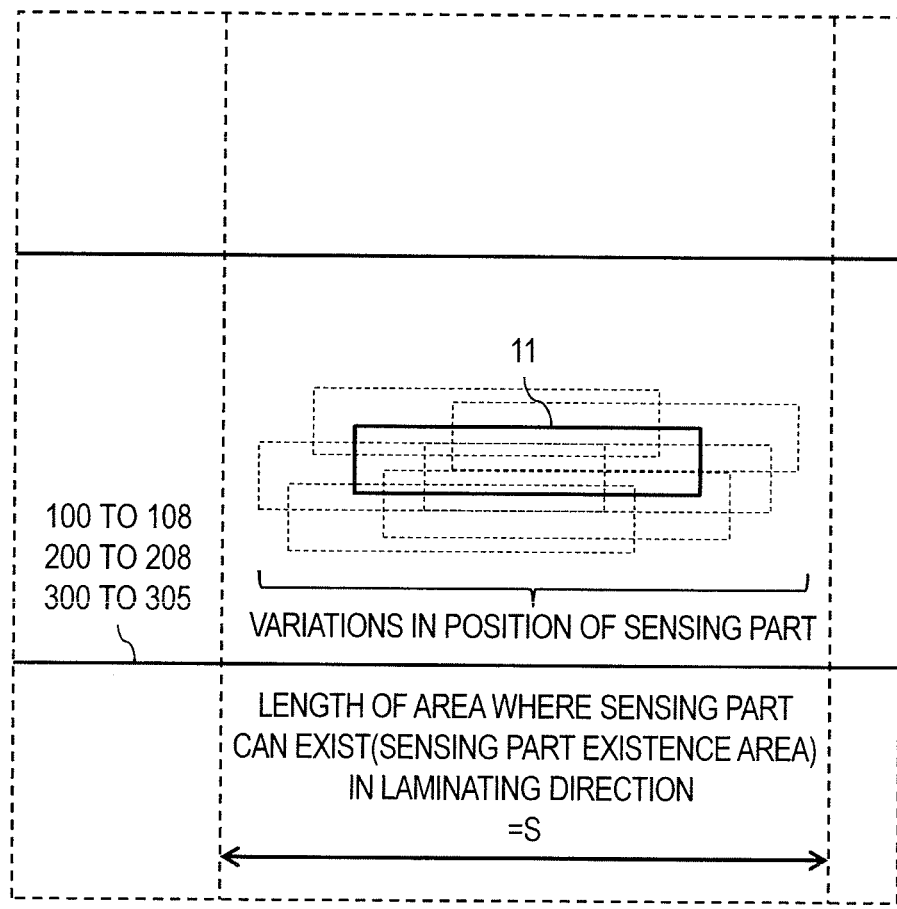
FIG. 7 is a diagram schematically illustrating variations in position of the Hall IC sensing part included in the current sensor according to the embodiments of the present invention.

Next, positional variations of the Hall IC sensing part 11 are described with reference to FIG. 7. As illustrated in FIG. 7, there is a possibility that the Hall IC sensing part 11 may have positional variations in a core outer edge-center direction and a core upper surface-lower surface direction depending on the product or due to addition of vibrations in use. This is the same as the case of Patent Literature 1. In the present invention, an area estimated at maximum as a positional variation of the Hall IC sensing part 11 is defined in advance as a sensing part existence area. The sensing part existence area may be estimated by calculating a maximum backlash that theoretically occurs, from a design value of a backlash occurring between the case 50 and the magnetic core 100 (101 to 108, 200 to 208, 300 to 305), a design value of a backlash occurring between the lid 60 and the case 50, and a design value of a backlash occurring between the lid 60 and the Hall IC 15. Also, this may be estimated by conducting a sampling inspection on an actually assembled product to actually measure the position of the Hall IC 15 in an assembled state. The sensing part existence area can be sufficiently set with a margin as an area where the Hall IC sensing part 11 reliably exists. The length of the sensing part existence area in a laminating direction is represented as S, and is used as a parameter for determining a magnetic flux density distribution of the magnetic core, which will be described further below. Here, as described above, the laminating direction of the magnetic core of the present invention can be any direction except the circumferential direction of the core. For example, when the magnetic core is formed on a concentric ring, the laminating direction is the core outer edge-center direction. Therefore, in this case, the length S of the sensing part existence area in the laminating direction is determined based on a maximum deviation position of the outer-edge-direction end part 11a of the Hall IC sensing part 11 in the outer edge direction and a maximum deviation position in the center-direction end part 11b of the Hall IC sensing part 11 in the center direction. Also, for example, when the magnetic core is formed with lamination in a conducting direction of the measurement target current, the laminating direction is the core upper surface-lower surface direction. Therefore, in this case, the length S of the sensing part existence area in the laminating direction is determined based on a maximum deviation position of the upper-direction end part 11c of the Hall IC sensing part 11 in the upper direction and a maximum deviation position in the lower-direction end part 11d of the Hall IC sensing part 11 in the lower direction.

Figure 8:
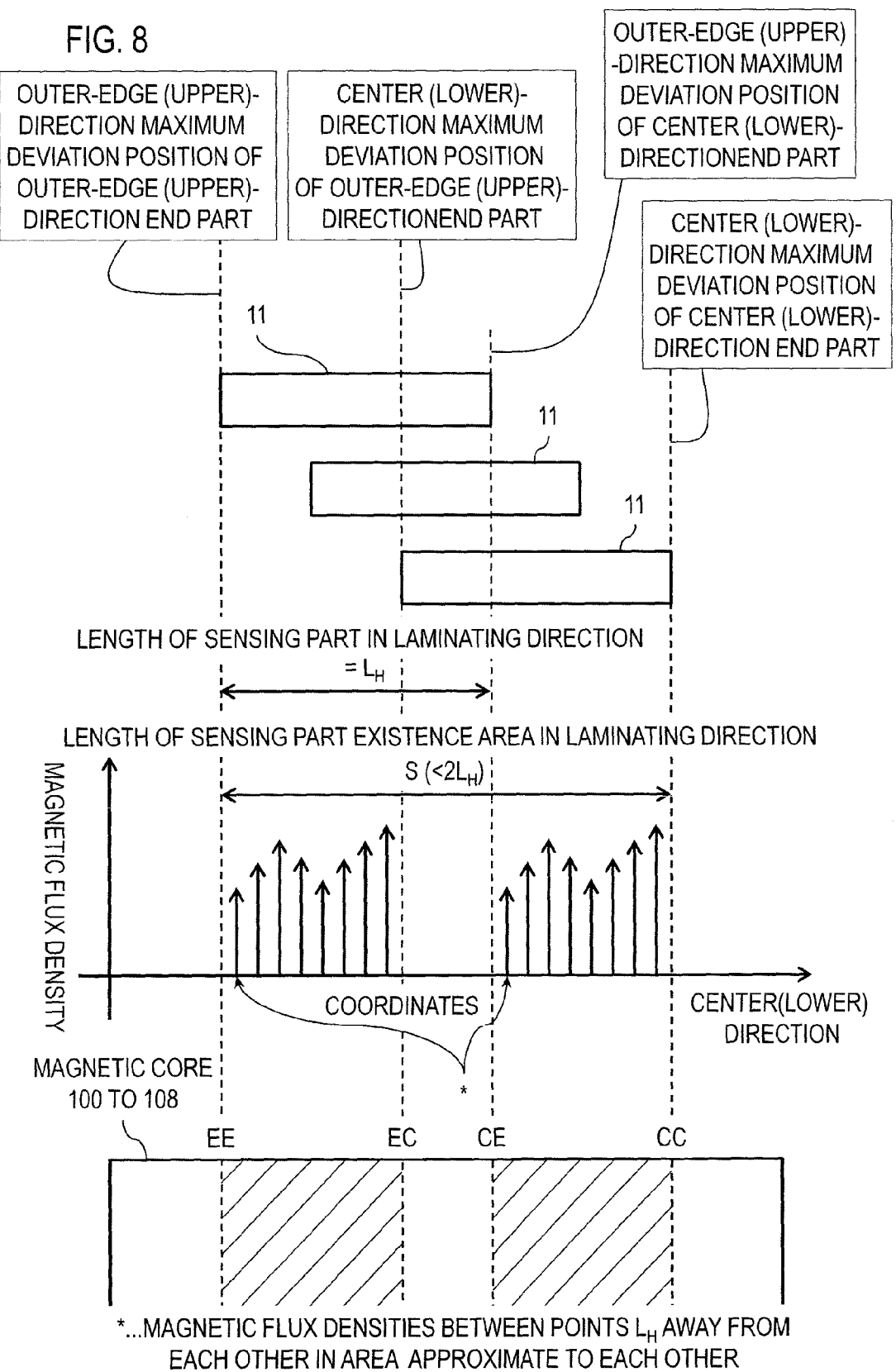
FIG. 8 is a diagram schematically illustrating characteristics of a magnetic flux density distribution of the current sensor of a first embodiment in a gap.
Figure 9:
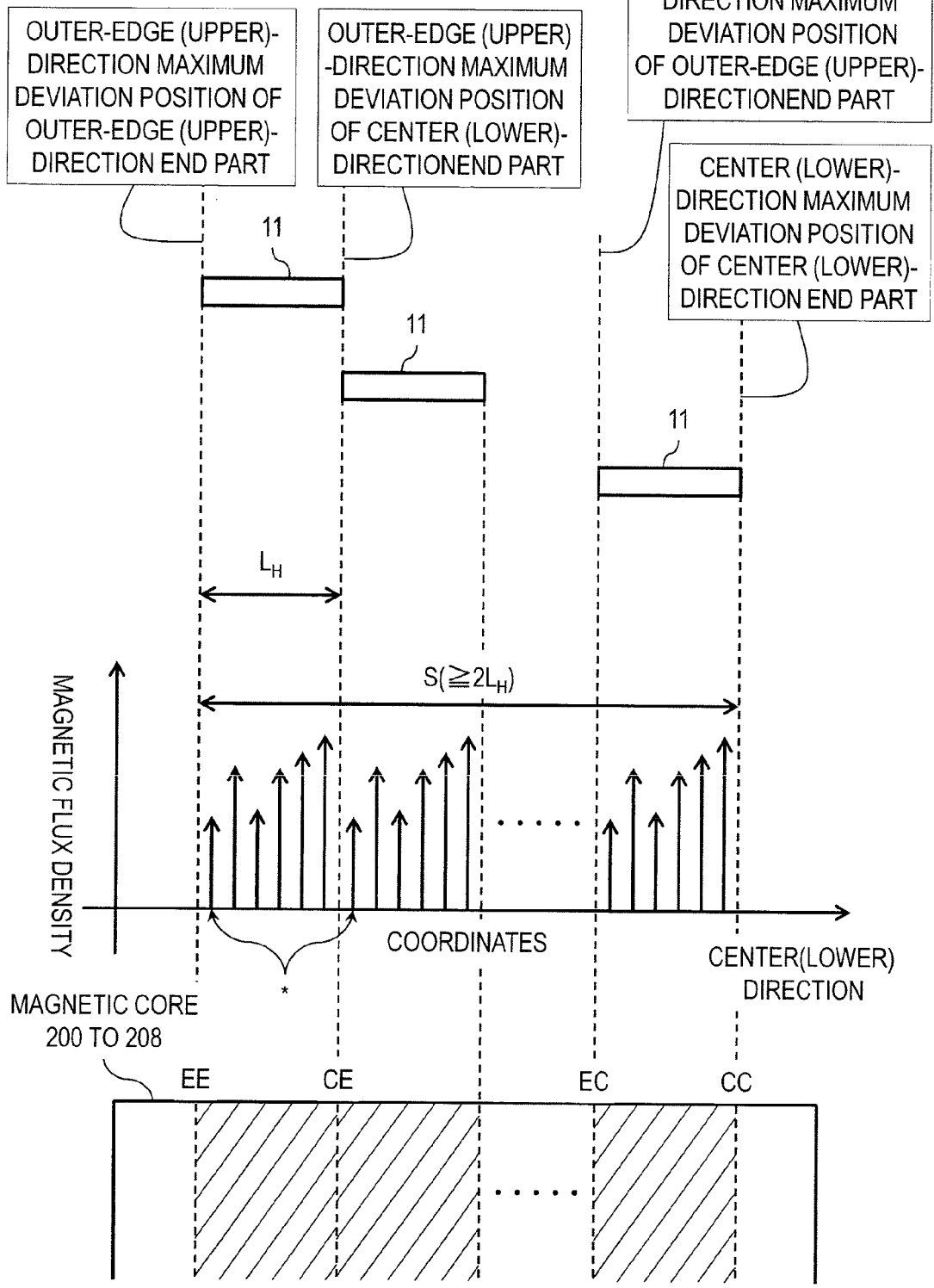
FIG. 9 is a diagram schematically illustrating characteristics of a magnetic flux density distribution of the current sensor of a second embodiment in a gap.

The sensing part existence area is discussed in further detail below by using FIG. 8 and FIG. 9. Here, the length of the Hall IC sensing part 11 in the laminating direction is represented as $L_H$, and the case of $S<2L_H$ is described below as a first embodiment and the case of $S \geq 2L_H$ is described below as a second embodiment. FIG. 8 is a diagram schematically illustrating characteristics of a magnetic flux density distribution of the current sensor of the first embodiment in a gap. FIG. 9 is a diagram schematically illustrating characteristics of a magnetic flux density distribution of the current sensor of the second embodiment in a gap.

As illustrated in FIG. 8, when the laminating direction is the core outer edge-center direction, coordinates of the outer-edge-direction maximum deviation position of the outer-edge-direction end part 11a in the laminating direction are referred to as EE. Similarly, coordinates of the center-direction maximum deviation position of the outer-edge-direction end part 11a in the laminating direction are referred to as EC. Similarly, coordinates of the outer-edge-direction maximum deviation position of the center-direction end part 11b in the laminating direction are referred to as CE. Similarly, coordinates of the center-direction maximum deviation position of the center-direction end part 11b in the laminating direction are referred to as CC.

On the other hand, when the laminating direction is the core upper surface-lower surface direction, coordinates of the upper-direction maximum deviation position of the upper-direction end part 11c in the laminating direction are referred to as EE. Similarly, coordinates of the lower-direction maximum deviation position of the upper-direction end part 11c in the laminating direction are referred to as EC. Similarly, coordinates of the upper-direction maximum deviation position of the lower-direction end part 11d in the laminating direction are referred to as CE. Similarly, coordinates of the lower-direction maximum deviation position of the lower-direction end part 11d in the laminating direction are referred to as CC. The coordinates EE, EC, CE, and CC are used also in FIG. 9 with the same definition.

In the case of FIG. 8, since $S<2L_H$ is a precondition, whatever the laminating direction is, the order of coordinates is as EE, EC, CE, and CC from left. Here, consider that starting with the left end of the Hall IC sensing part 11 at the coordinates EE, the Hall IC sensing part 11 is gradually moved in a right direction in the drawing to reach with the right end of the Hall IC sensing part 11 at the coordinates CC. Here, it can be found that, as the Hall IC sensing part 11 is moving rightward, magnetic fluxes occurring near the right of the coordinates EE cease to pass through the Hall IC sensing part 11. Instead, magnetic fluxes occurring near the right of the coordinates CE newly become penetrating through the Hall IC sensing part 11. To keep the total number of magnetic fluxes penetrating through the Hall IC sensing part 11 constant, magnetic flux density at coordinates where the movement of the Hall IC sensing part 11 ceases to influence the Hall IC sensing part 11 and magnetic flux density at coordinates where the movement newly influences the Hall IC sensing part 11 preferably approximate to each other. Specifically, magnetic flux densities near the coordinates EE and near the coordinates CE preferably approximate to each other. Similarly, magnetic flux densities near the coordinates EC and near the coordinates CC preferably approximate to each other. These relevant coordinates are a distance $L_H$ away from each other. Note that, between the coordinates EC and the coordinates CE, no condition is imposed on magnetic fluxes. The reason is as follows. With the condition of $S<2L_H$, magnetic fluxes penetrating through the Hall IC sensing part 11 always occur in this area at whichever position the Hall IC sensing part 11 is positioned in the sensing part existence area, and therefore this area does not influence the total number of magnetic fluxes penetrating through the Hall IC sensing part 11.

Also, a section between the left end part of the core in the drawing and the coordinates EE and a section between the coordinates CC and the right end part of the core in the drawing, the sections not influencing the Hall IC sensing part 11, do not influence the total number of magnetic fluxes penetrating through the Hall IC sensing part 11, and therefore no condition is imposed.

The condition to be satisfied by the magnetic cores 100 to 108 of the current sensor of the first embodiment described with reference to FIG. 8 is summarized again. The magnetic cores 100 to 108 of the current sensor of the first embodiment are formed on condition that the magnetic flux densities of two points with a distance of $L_H$ in a laminating direction away from each other in the sensing part existence area approximate to each other. With the condition of $S<2L_H$, points of the coordinates in the section between the coordinates EC and the coordinates CE with the relevant distance of $L_H$ away from each other are present only outside the sensing part existence area, and therefore no condition is imposed.

On the other hand, in the case of FIG. 9, since $S \geq 2L_H$ is a precondition, whatever the laminating direction is, the order of coordinates is as EE, CE, EC, and CC from left. Here, consider that starting with the left end of the Hall IC sensing part 11 at the coordinates EE, the Hall IC sensing part 11 is gradually moved in a right direction in the drawing to reach with the right end of the Hall IC sensing part 11 at the coordinates CC. Here, it can be found that, as the Hall IC sensing part 11 is moving rightward, magnetic fluxes occurring near the coordinates EE cease to pass through the Hall IC sensing part 11. Instead, magnetic fluxes occurring near the coordinates CE newly become penetrating through the Hall IC sensing part 11. To keep the total number of magnetic fluxes penetrating through the Hall IC sensing part 11 constant, magnetic flux density at coordinates where the movement of the Hall IC sensing part 11 ceases to influence the Hall IC sensing part 11 and magnetic flux density at coordinates where the movement newly influences the Hall IC sensing part 11 preferably approximate to each other. Specifically, magnetic flux densities near the coordinates EE and near the coordinates CE preferably approximate to each other. These relevant coordinates are a distance $L_H$ away from each other. This is similar to FIG. 8. However, in the case of FIG. 9, an area where no condition is imposed existing between the coordinates EC and CE in FIG. 8 does not exist.

Also, the section between the left end part of the core in the drawing and the coordinates EE and the section between the coordinates CC and the right end part of the core in the drawing, the sections not influencing the Hall IC sensing part 11, do not influence the total number of magnetic fluxes penetrating through the Hall IC sensing part 11, and therefore no condition is imposed. This is the same as the case of FIG. 8.

The conditions to be satisfied by the magnetic cores 200 to 208 of the current sensor of the second embodiment described with reference to FIG. 9 is summarized again. The magnetic cores 200 to 208 of the current sensor of the second embodiment are formed on condition that the magnetic flux densities of two points with a distance of $L_H$ in a laminating direction away from each other in the sensing part existence area approximate to each other.

Since the high-level concept of the present invention described with reference to FIG. 8 and FIG. 9 only defines that magnetic flux densities of any two points $L_H$ away from each other in the region approximate to each other, for example, the magnetic flux density distribution in a section between the coordinates EE and CC in FIG. 8 may be an irregular distribution. Similarly, the magnetic flux density distribution in a section between the coordinates EE and CE in FIG. 9 may be an irregular distribution.

Figure 10:
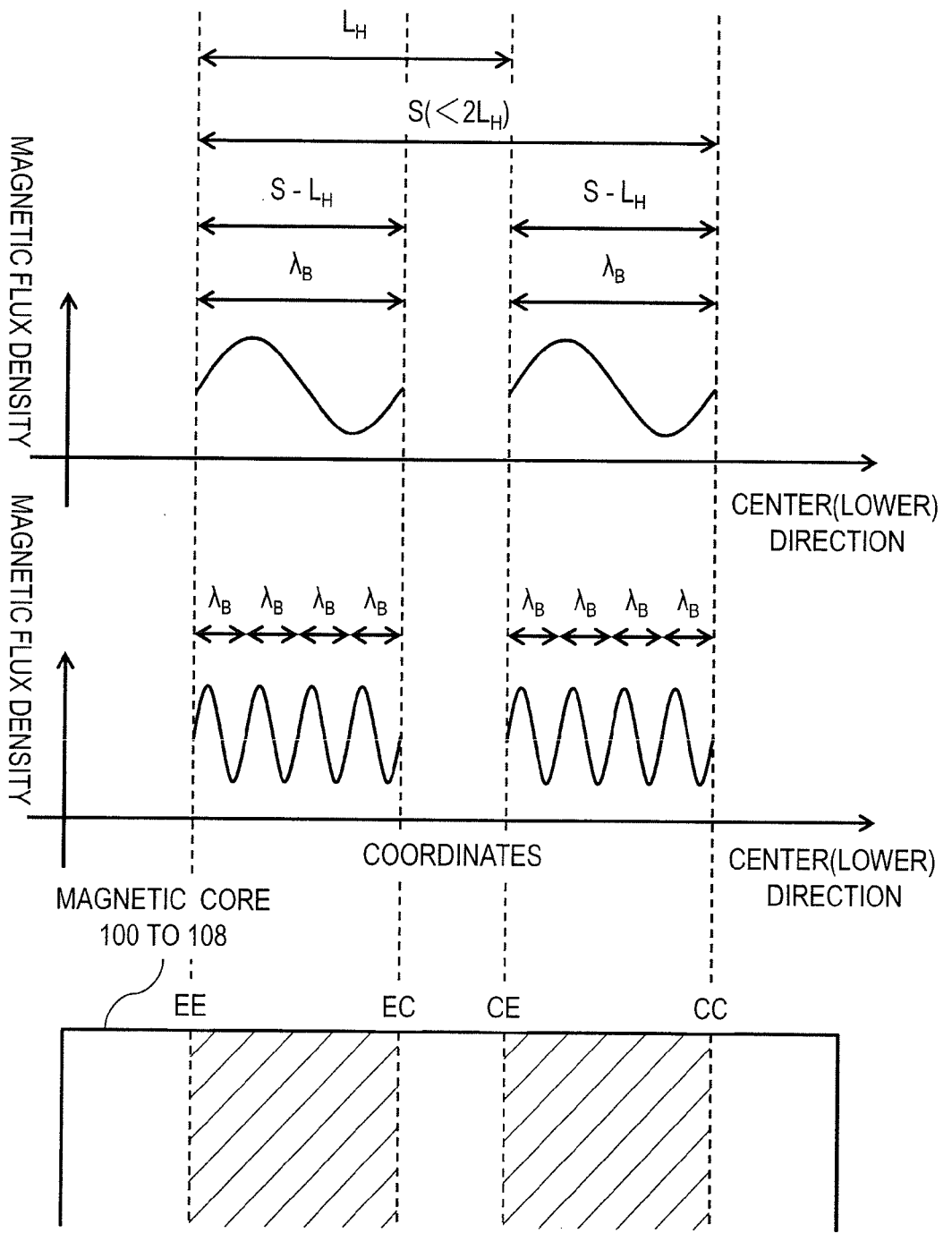
FIG. 10 is a diagram schematically illustrating regularity of a magnetic flux density distribution of the magnetic core included in the current sensor of the first embodiment.
Figure 11:
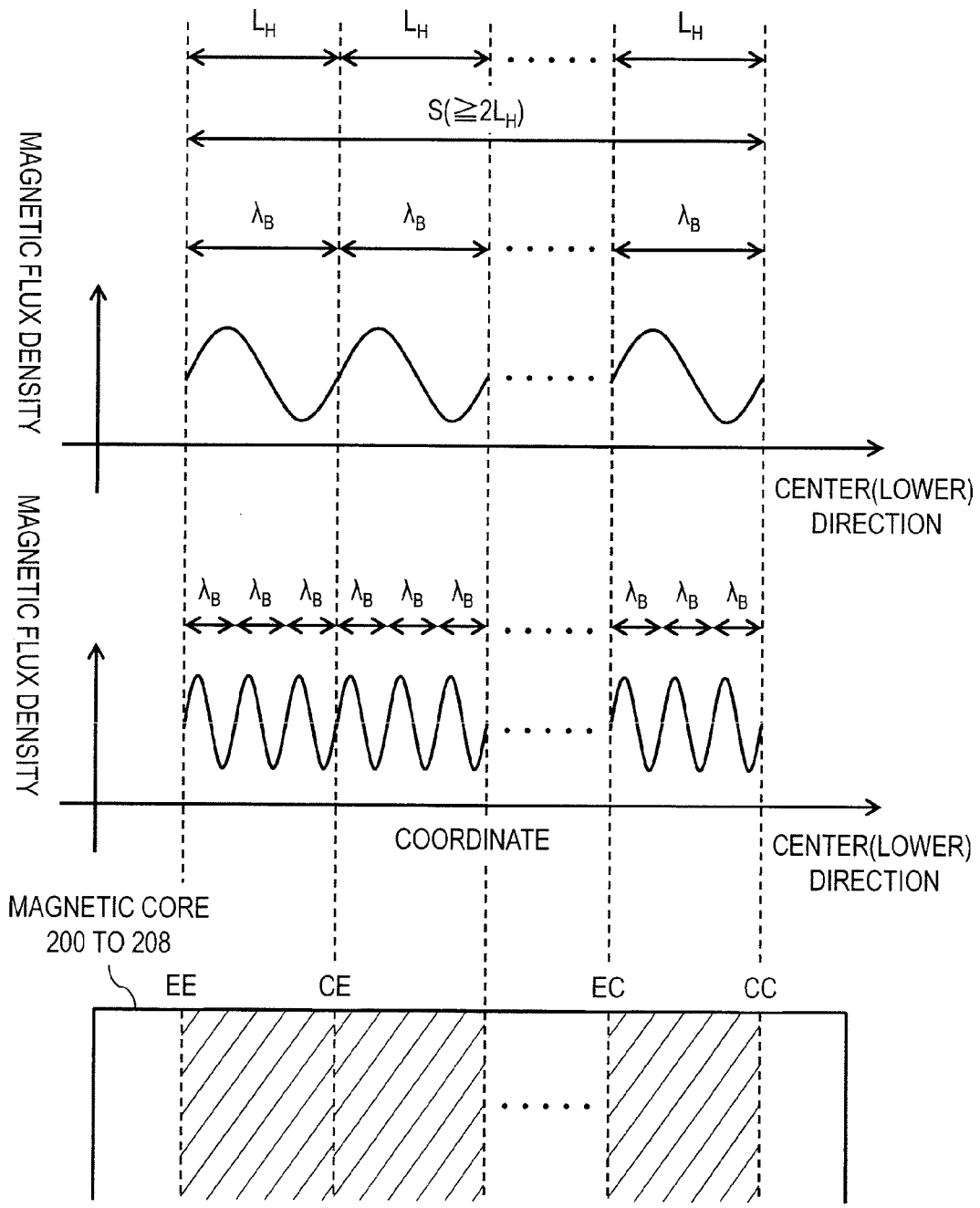
FIG. 11 is a diagram schematically illustrating regularity of a magnetic flux density distribution of the magnetic core included in the current sensor of the second embodiment.

Conditions to be satisfied by the magnetic flux density distribution occurring from the magnetic cores of the first and second embodiments of the present invention are discussed in further detail below with reference to FIG. 10 and FIG. 11. FIG. 10 is a diagram schematically illustrating regularity of the magnetic flux density distribution of the magnetic core included in the current sensor of the first embodiment. FIG. 11 is a diagram schematically illustrating regularity of the magnetic flux density distribution of the magnetic core included in the current sensor of the second embodiment.

As described above, in the high-level concept of the present invention, if magnetic flux densities of any two points $L_H$ away from each other in the existence area approximate to each other to have a mutual compensation relation, fluctuations in sensitivity of the current sensor can be suppressed. In other words, in the condition of $S<2L_H$ of the first embodiment, since the laminating-direction distance between the coordinates EE and the coordinates EC is $S-L_H$, a cyclic distribution of a wavelength of $\lambda_B=S-L_H$ is present at least between the coordinates EE and EC. Similarly, if a cyclic distribution of a wavelength of $\lambda_B=S-L_H$ is present between the coordinates CE and CC, a compensation relation is established. Furthermore, as for the wavelength $\lambda_B$ of the magnetic flux density distribution, as illustrated in FIG. 10, a compensation relation is established even if the magnetic flux density distribution has regularity at a cycle of $(S-L_H)/m$ (where m is an integer equal to or larger than 1). The graph in the middle stage of FIG. 10 is illustrated with m=4.

On the other hand, under the condition of $S\geq 2L_H$ in the second embodiment, since the distance between the coordinates EE and the coordinates CE in the laminating direction is $L_H$, if a cyclic distribution with the wavelength $\lambda_B=L_H$ is present at least between the coordinates EE and CE, the cyclic distribution with the wavelength $\lambda_B=L_H$ is present also in each of the following sections of the length $L_H$, and the cyclic distribution with the wavelength $\lambda_B=L_H$ is present similarly between the coordinates EC and CC, a compensation relation is established. Furthermore, as for the wavelength 4 of the magnetic flux density distribution, as illustrated in FIG. 11, a compensation relation is established even if the magnetic flux density distribution has regularity at a cycle of $L_H/m$ (where m is an integer equal to or larger than 1). The graph in the middle stage of FIG. 11 is illustrated with m=3.

[First Embodiment]

Figure 12A:
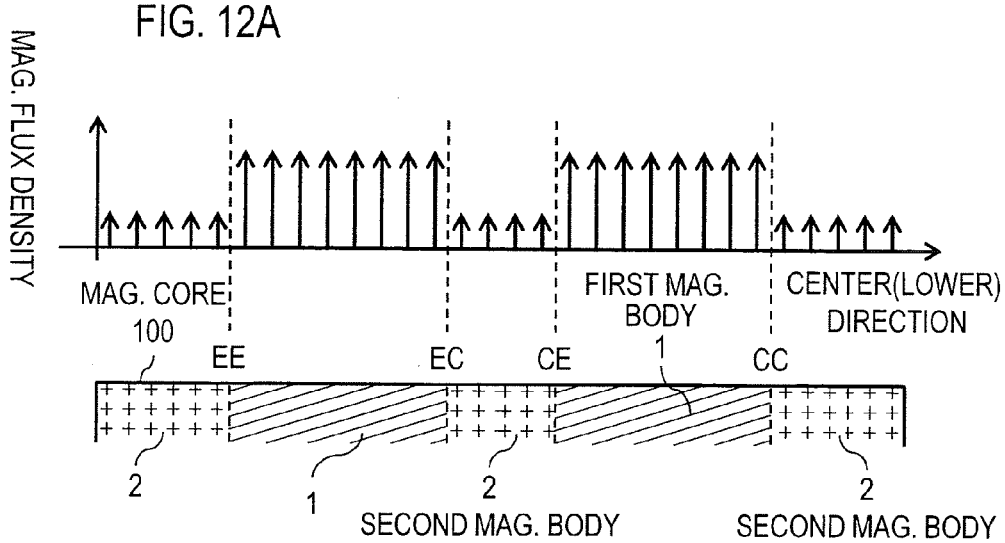
FIG. 12A is a schematic diagram illustrating a first application example adoptable for the current sensor of the first embodiment.
Figure 12B:
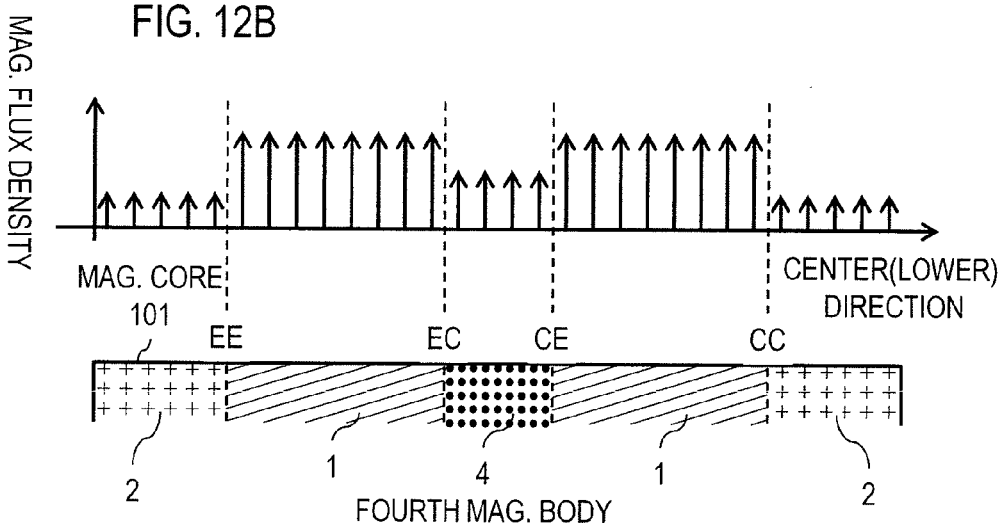
FIG. 12B is a schematic diagram illustrating a second application example adoptable for the current sensor of the first embodiment.
Figure 12C:
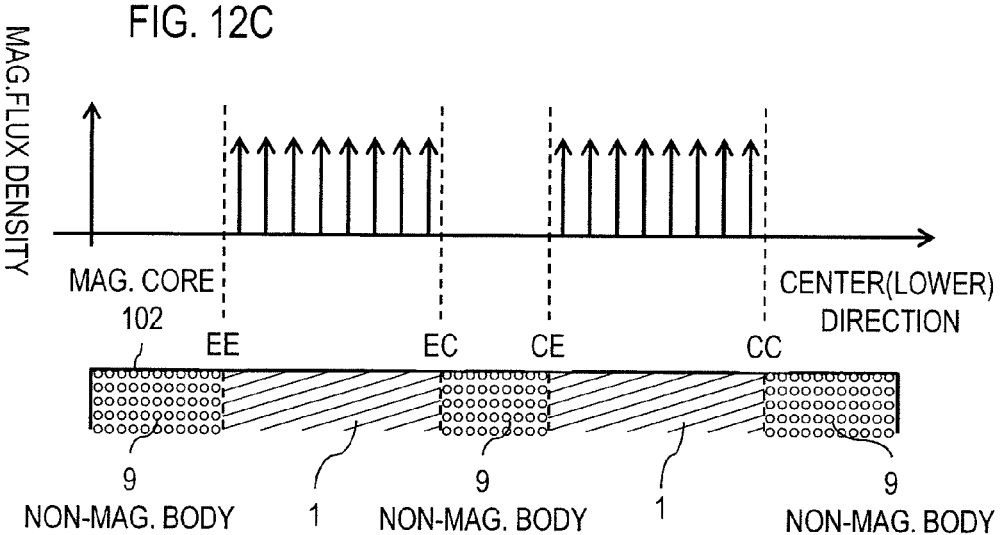
FIG. 12C is a schematic diagram illustrating a third application example adoptable for the current sensor of the first embodiment.

A first application example to a third application example adoptable for the magnetic core of the current sensor of the first embodiment are described below with reference to FIG. 12. FIG. 12 illustrates schematic diagrams illustrating application examples adoptable for the current sensor of the first embodiment. FIG. 12A is a schematic diagram illustrating the structure of the magnetic core 100 of the first application example, FIG. 12B is a schematic diagram illustrating the structure of the magnetic core 101 of the second application example, and FIG. 12C is a schematic diagram illustrating the structure of the magnetic core 102 of the third application example.

[First Application Example]

As described above, the condition is that magnetic flux densities of any two points $L_H$ away from each other in the existence area approximate to each other, and no condition is imposed on the magnetic flux densities between the coordinates EC and CE. Therefore, for example, the section between the coordinates EE and EC is configured of only a magnetic body of one type (which is taken as a first magnetic body 1) so that magnetic flux densities are flatly distributed, and the section between the coordinates CE and CC where points $L_H$ away from the respective coordinate points between the coordinates EE and EC exist is also configured of only the same first magnetic body 1 to achieve a magnetic flux density distribution where the section between the coordinates CE and CC is flat. Since no condition is imposed on the section between the core left end part in the drawing and the coordinates EE, the section between the coordinates CC and the core right end part in the drawing, and the section between the coordinates EC and CE of the magnetic core 100, for example, layers of a second magnetic body 2 different from the first magnetic body 1 are preferably formed.

[Second Application Example]

As an application example in which the magnetic core 100 is modified, as the magnetic core 101 of the present application example, the section between the coordinates EC and CE may be configured of a material different from the first magnetic body 1 and the second magnetic body 2 (the material is taken as a fourth magnetic body 4). In this case, a magnetic core is formed of magnetic bodies of three types.

[Third Application Example]

As an application example in which the magnetic core 100 is modified, as the magnetic core 102 of the present application example, the section between the core left end part in the drawing and the coordinates EE, the section between the coordinates CC and the core right end part in the drawing, and the section between the coordinates EC and CE may be configured of a substance that is not a magnetic body (the substance is taken as a non-magnetic body 9). As such, even if a non-magnetic body is included, fluctuations in sensitivity of the current sensor due to positional deviation of the Hall IC sensing part 11 can be suppressed as long as a magnetic-flux compensation relation holds. Other than these, the section between the core left end part in the drawing and the coordinates EE, the section between the coordinates CC and the core right end part in the drawing, and the section between the coordinates EC and CE may be configured by laminating magnetic bodies of a plurality of types.

Figure 13A:
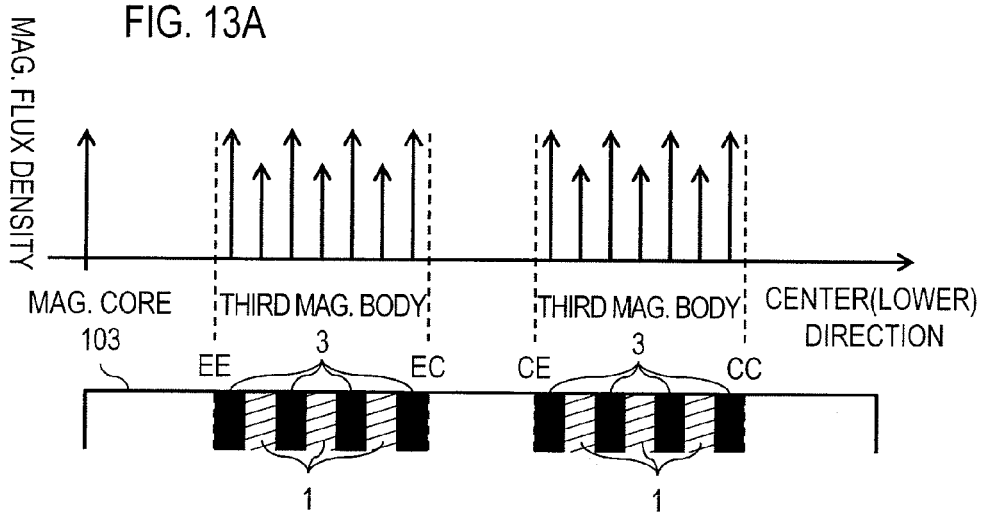
FIG. 13A is a schematic diagram illustrating a fourth application example adoptable for the current sensor of the first embodiment.
Figure 13B:
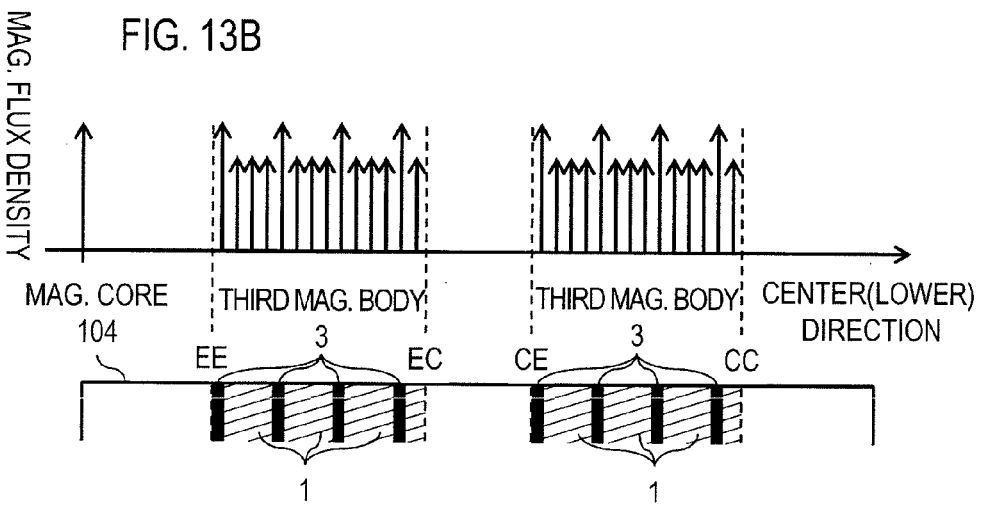
FIG. 13B is a schematic diagram illustrating a fifth application example adoptable for the current sensor of the first embodiment.
Figure 13C:
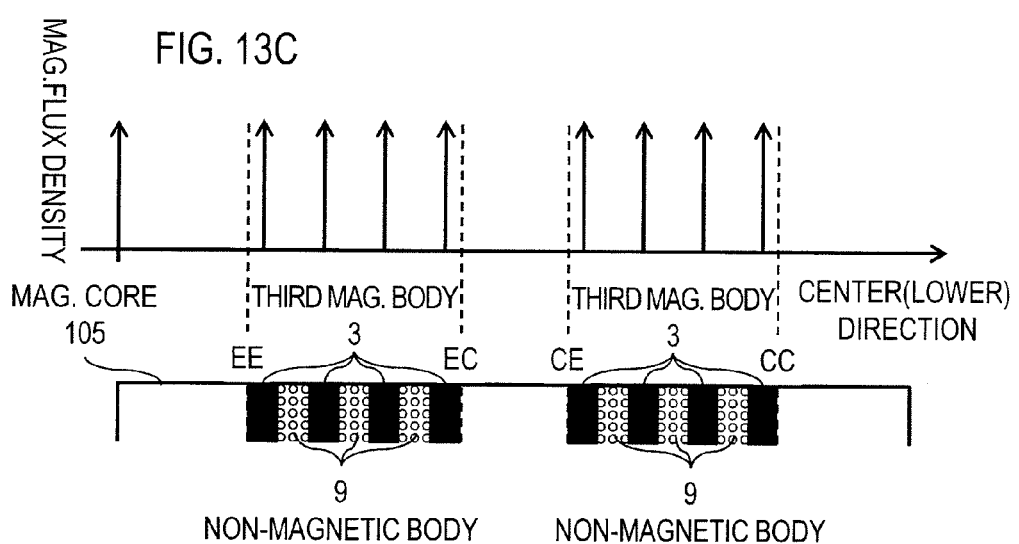
FIG. 13C is a schematic diagram illustrating a sixth application example adoptable for the current sensor of the first embodiment.

A fourth application example to a sixth application example adoptable for the magnetic core of the current sensor of the first embodiment are described below with reference to FIG. 13. FIG. 13 illustrates schematic diagrams illustrating application examples adoptable for the current sensor of the first embodiment. FIG. 13A is a schematic diagram illustrating the structure of the magnetic core 103 of the fourth application example, FIG. 13B is a schematic diagram illustrating the structure of the magnetic core 104 of the fifth application example, and FIG. 13C is a schematic diagram illustrating the structure of the magnetic core 105 of the sixth application example.

[Fourth Application Example]

As described above, the condition is that magnetic flux densities of any two points $L_H$ away from each other in the existence area approximate to each other, and no condition is imposed on the magnetic flux densities between the coordinates EC and CE. Therefore, for example, a magnetic body may be formed by arranging, between CE and CC, magnetic bodies of two types in any pattern between EE and EC and arranging the magnetic bodies of two types used between EE and EC in the same pattern as that in the arrangement between EE and EC. As illustrated in FIG. 13A, in the magnetic core 103 of the present application example, the first magnetic body 1 and the third magnetic body 3 are alternately arranged in the sections between the coordinates EE and EC and between CE and CC to form the same magnetic flux density distribution. Note that while mention of a section between a core left end in the drawing and the coordinates EE, a section between the coordinates CC and a core right end part in the drawing, and a section between the coordinates EC and CE is omitted in the present application example and the following fifth to ninth application examples, as with the first to third application examples, these sections may be configured in any manner, such as being formed of a magnetic body or a non-magnetic body or by laminating magnetic bodies of a plurality of types.

[Fifth Application Example]

The magnetic core 104 of the present application example is similar to that of the fourth application example in that the first magnetic body 1 and the third magnetic body 3 are alternately arranged in the sections between the coordinates EE and EC and between CE and CC to form the same magnetic flux density distribution, but the layer thicknesses of the first magnetic body 1 and the third magnetic body 3 are varied. Specifically, the third magnetic body 3 is formed so as to be thinner than the layer of the first magnetic body 1.

[Sixth Application Example]

As with the fourth and fifth application examples, the magnetic core 105 of the present application example is formed by alternately arranging materials of two types in the sections between the coordinates EE and EC and between CE and CC. The magnetic core 105 of the present application example is formed by alternately laminating a magnetic body (indicated as the third magnetic body 3 in the drawing, but the type of magnetic body is not particularly restricted) and the non-magnetic body 9. As such, a magnetic core can be formed also by using a magnetic body and a non-magnetic body and laminating these bodies in any pattern in the sections between the coordinates EE and EC and between CE and CC.

Figure 14A:
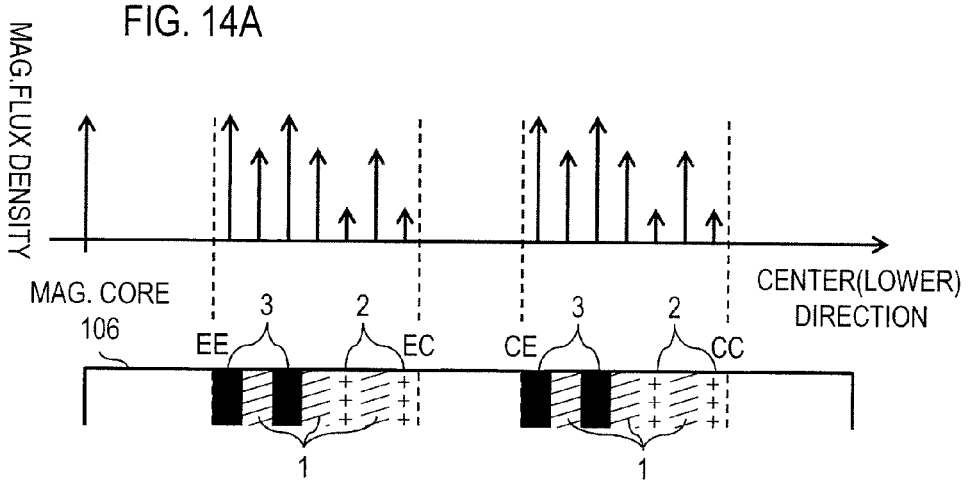
FIG. 14A is a schematic diagram illustrating a seventh application example adoptable for the current sensor of the first embodiment.
Figure 14B:
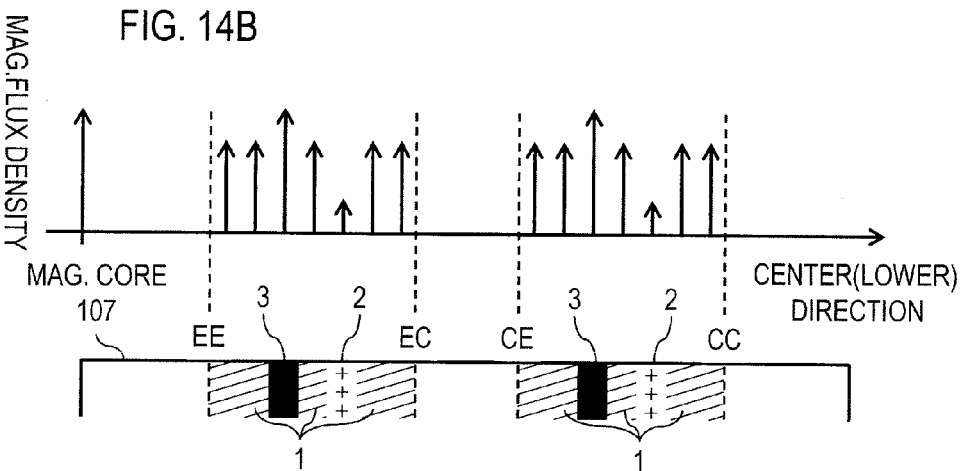
FIG. 14B is a schematic diagram illustrating an eighth application example adoptable for the current sensor of the first embodiment.
Figure 14C:
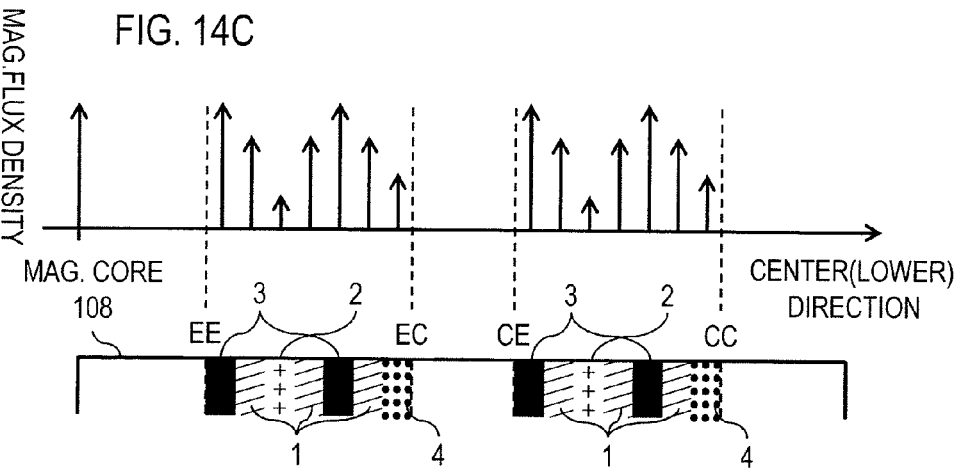
FIG. 14C is a schematic diagram illustrating a ninth application example adoptable for the current sensor of the first embodiment.

A seventh application example to a ninth application example adoptable for the magnetic core of the current sensor of the first embodiment are described below with reference to FIG. 14. FIG. 14 illustrates schematic diagrams illustrating application examples adoptable for the current sensor of the first embodiment. FIG. 14A is a schematic diagram illustrating the structure of the magnetic core 106 of the seventh application example, FIG. 14B is a schematic diagram illustrating the structure of the magnetic core 107 of the eighth application example, and FIG. 14C is a schematic diagram illustrating the structure of the magnetic core 108 of the ninth application example.

[Seventh Application Example]

As described above, the condition is that magnetic flux densities of any two points $L_H$ away from each other in the existence area approximate to each other, and no condition is imposed on the magnetic flux densities between the coordinates EC and CE. Therefore, for example, a magnetic body may be formed by arranging magnetic bodies of three types in any pattern between EE and EC and arranging, between CE and CC, the magnetic bodies of three types used between EE and EC in the same pattern as that in the arrangement between EE and EC. As illustrated in FIG. 14A, in the magnetic core 106 of the present application example, the first magnetic body 1, the second magnetic body 2, and the third magnetic body 3 are arranged in the same pattern in the sections between the coordinates EE and EC and between CE and CC to form the same magnetic flux density distribution.

[Eighth Application Example]

As with the seventh application example, in the magnetic core 107 of the present application example, the first magnetic body 1, the second magnetic body 2, and the third magnetic body 3 are arranged in the sections between the coordinates EE and EC and between CE and CC to form the same magnetic flux density distribution. In the present application example, the first magnetic body 1 is formed so as to be thicker than other layers.

[Ninth Application Example]

The magnetic core 108 of the present application example is formed by arranging magnetic bodies of four types (the first magnetic body 1, the second magnetic body 2, the third magnetic body 3, and the fourth magnetic body 4) in the sections between the coordinates EE and EC and between CE and CC to form the same magnetic flux density distribution. As such, while the magnetic core formed by irregularly arranging magnetic bodies of a plurality of types is described in the seventh application example to the ninth application example, it goes without saying that these may be regularly arranged to form a magnetic core. In this case, as described with reference to FIG. 10, under the condition of $S<2L_H$, a compensation relation is established even with regularity in a cycle of a wavelength $\lambda_B=(S-L_H)/m$ (where m is an integer equal to or larger than 1) of the magnetic flux density distribution.

As such, according to the magnetic cores 100 to 108 of the current sensor of the first embodiment of the present invention, since fluctuations in sensitivity of the current sensor due to positional variations can be suppressed when the Hall IC 15 is arranged in the gap 20, variations among products (among operations) of the current sensor can be suppressed, and a current sensor with higher accuracy can be achieved.

Also, as the magnetic cores 100 to 108 of the current sensor of the first embodiment of the present invention, by adopting a laminating structure with a plurality of materials, demerits of each material can be compensated for, and merits of each substance can be enjoyed. For example, an electromagnetic steel plate has a demerit of being incapable of measurement of high-frequency current equal to or higher than 10 kHz due to iron loss such as eddy-current loss. However, by combining the electromagnetic steel plate and a material with favorable frequency characteristics to form a magnetic core, a current sensor with improved frequency characteristics can be achieved. Also, for example, ferrite has a demerit of small saturation magnetic flux density and a decrease in sensor sensitivity in a large-current area. However, by laminating ferrite and an oriented electromagnetic steel plate with high saturation magnetic flux density to form a magnetic core, a current sensor with improved sensitivity in the large-current area can be achieved. Furthermore, an amorphous magnetic alloy has favorable characteristics as a soft magnetic material, but has a demerit of weak mechanical strength. However, by laminating the amorphous magnetic alloy and an oriented electromagnetic steel plate with high mechanical strength to form a magnetic core, a magnetic core and current sensor with high mechanical strength can be achieved.

[Second Embodiment]

A tenth application example to a twelfth application example adoptable for a magnetic core of the current sensor of the second embodiment are described below with reference to FIG. 15. FIG. 15 illustrates schematic diagrams illustrating application examples adoptable for the current sensor of the second embodiment. FIG. 15A is a schematic diagram illustrating the structure of the magnetic core 200 of the tenth application example, FIG. 15B is a schematic diagram illustrating the structure of the magnetic core 201 of the eleventh application example, and FIG. 15C is a schematic diagram illustrating the structure of the magnetic core 202 of the twelfth application example.

[Tenth Application Example]

As described above, the condition is that magnetic flux densities of any two points $L_H$ away from each other in the existence area approximate to each other. Therefore, the section between the coordinates EE and CC is preferably configured of only a magnetic body of one type (the first magnetic body 1) so that magnetic flux densities are flatly distributed. Since no condition is imposed on the section between the core left end part in the drawing and the coordinates EE and the section between the coordinates CC and the core right end part in the drawing of the magnetic core 200, for example, layers of the second magnetic body 2 different from the first magnetic body 1 are preferably formed.

[Eleventh Application Example]

As an application example in which the magnetic core 200 is modified, as the magnetic core 201 of the present application example, the section between the coordinates CC and the core right end part in the drawing may be configured of a material different from the first magnetic body 1 and the second magnetic body 2 (the material is taken as the fourth magnetic body 4). In this case, a magnetic core is formed of magnetic bodies of three types.

[Twelfth Application Example]

As an application example in which the magnetic core 200 is modified, as the magnetic core 202 of the present application example, the section between the core left end part in the drawing and the coordinates EE and the section between the coordinates CC and the core right end part in the drawing may be configured of a substance that is not a magnetic body (the non-magnetic body 9). As such, even if a non-magnetic body is included, fluctuations in sensitivity of the current sensor due to positional deviation of the Hall IC sensing part 11 can be suppressed as long as a magnetic-flux compensation relation holds. Other than these, the section between the core left end part in the drawing and the coordinates EE and the section between the coordinates CC and the core right end part in the drawing may be configured by laminating magnetic bodies of a plurality of types.

Figure 16A:
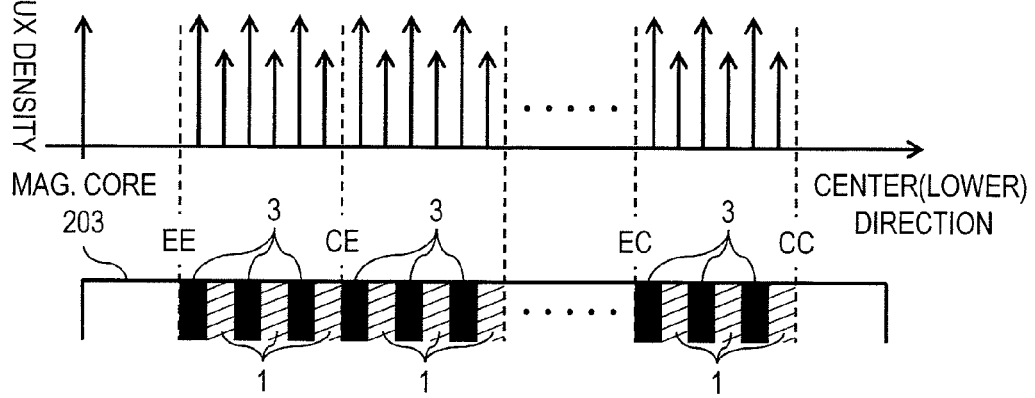
FIG. 16A is a schematic diagram illustrating a thirteenth application example adoptable for the current sensor of the second embodiment.
Figure 16B:
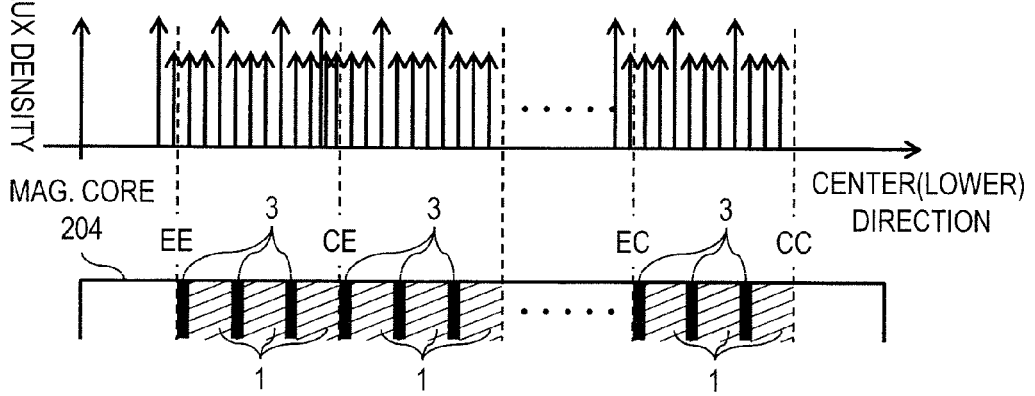
FIG. 16B is a schematic diagram illustrating a fourteenth application example adoptable for the current sensor of the second embodiment.
Figure 16C:
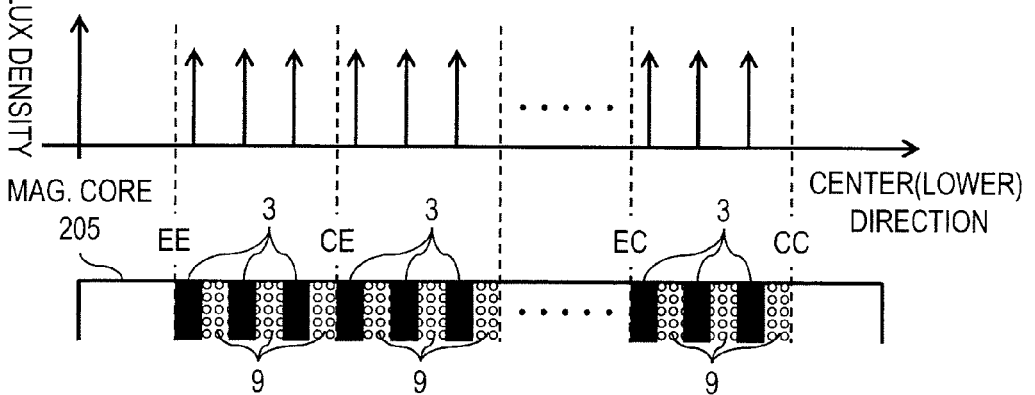
FIG. 16C is a schematic diagram illustrating a fifteen application example adoptable for the current sensor of the second embodiment.
Figure 18A:
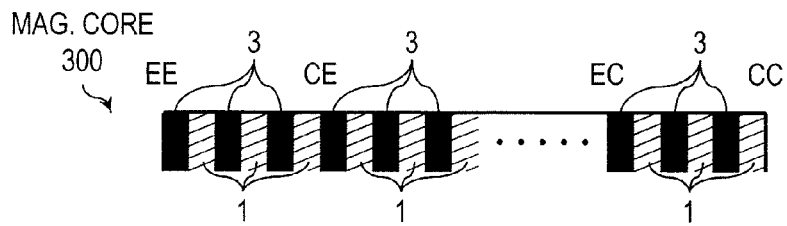
FIG. 18A is a schematic diagram illustrating a nineteenth application example adoptable for a current sensor of a third embodiment.
Figure 18B:
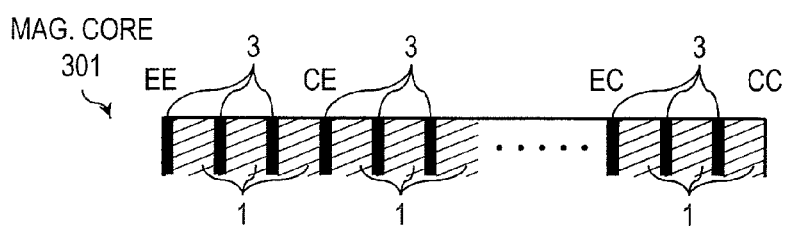
FIG. 18B is a schematic diagram illustrating a twentieth application example adoptable for a current sensor of the third embodiment.
Figure 18C:
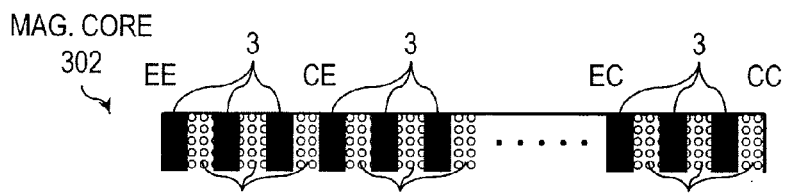
FIG. 18C is a schematic diagram illustrating a twenty-first application example adoptable for a current sensor of the third embodiment.
Figure 18D:
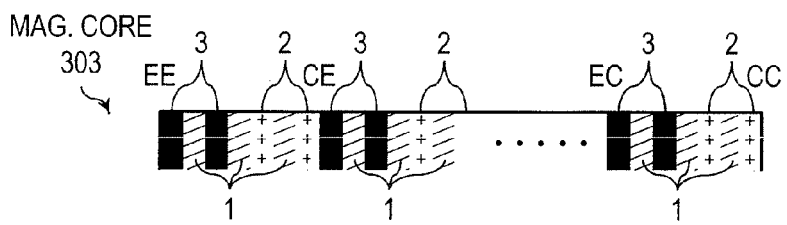
FIG. 18D is a schematic diagram illustrating a twenty-second application example adoptable for a current sensor of the third embodiment.
Figure 18E:
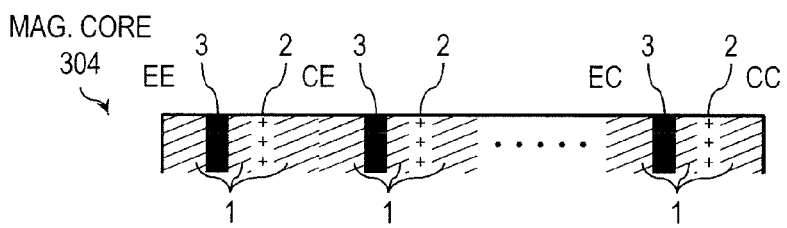
FIG. 18E is a schematic diagram illustrating a twenty-third application example adoptable for a current sensor of the third embodiment.
Figure 18F:
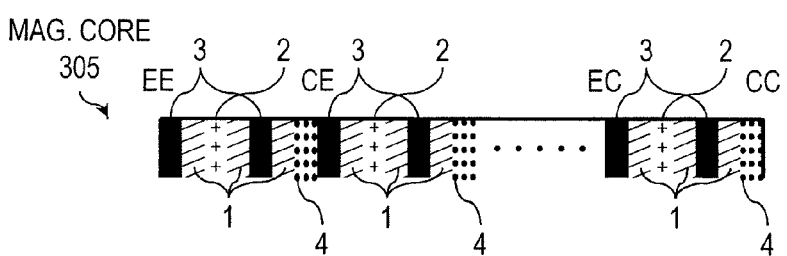
FIG. 18F is a schematic diagram illustrating a twenty-fourth application example adoptable for a current sensor of the third embodiment.

A thirteenth application example to a fifteenth application example adoptable for the magnetic core of the current sensor of the second embodiment are described below with reference to FIG. 16. FIG. 16 illustrates schematic diagrams illustrating application examples adoptable for the current sensor of the second embodiment. FIG. 16A is a schematic diagram illustrating the structure of the magnetic core 203 of the thirteenth application example, FIG. 16B is a schematic diagram illustrating the structure of the magnetic core 204 of the fourteenth application example, and FIG. 16C is a schematic diagram illustrating the structure of the magnetic core 205 of the fifteenth application example.

[Thirteenth Application Example]

As described above, the condition is that magnetic flux densities of any two points $L_H$ away from each other in the existence area approximate to each other. Therefore, as described with reference to FIG. 11, under the condition of $S \geq 2L_H$, a compensation relation is established even with regularity in a cycle of a wavelength $\lambda_B = L_H/m$ (where m is an integer equal to or larger than 1) of the magnetic flux density distribution. As illustrated in FIG. 16A, in the magnetic core 203 of the present application example, the first magnetic body 1 and the third magnetic body 3 are alternately arranged in a section between the coordinates EE and CC to form the wavelength $\lambda_B = L_H/3$. Note that while mention of the section between the core left end part in the drawing and the coordinates EE and the section between the coordinates CC and the core right end part in the drawing is omitted in the present application example and the following fourteenth to eighteenth application examples, as with the first to third application examples and the tenth to twelfth application examples, these sections may be configured in any manner, such as being formed of a magnetic body or a non-magnetic body or by laminating magnetic bodies of a plurality of types.

[Fourteenth Application Example]

The magnetic core 204 of the present application example is similar to that of the thirteenth application example in that the first magnetic body 1 and the third magnetic body 3 are alternately arranged in the section between the coordinates EE and CC to achieve the wavelength $\lambda_B = L_H/3$, but the layer thicknesses of the first magnetic body 1 and the third magnetic body 3 are varied. Specifically, the third magnetic body 3 is formed so as to be thinner than the layer of the first magnetic body 1.

[Fifteenth Application Example]

As with the thirteenth and fourteenth application examples, the magnetic core 205 of the present application example is formed by alternately arranging materials of two types in the section between the coordinates EE and CC to achieve the wavelength $\lambda_B = L_H/3$. The magnetic core 205 of the present application example is formed by alternately laminating a magnetic body (indicated as the third magnetic body 3 in the drawing, but the type of magnetic body is not particularly restricted) and the non-magnetic body 9. As such, a magnetic core can be formed also by using a magnetic body and a non-magnetic body and laminating these bodies in the section between the coordinates EE and CC with the wavelength $\lambda_B = L_H/m$.

A sixteenth application example to an eighteenth application example adoptable for the magnetic core of the current sensor of the second embodiment are described below with reference to FIG. 17. FIG. 17 illustrates schematic diagrams illustrating application examples adoptable for the current sensor of the second embodiment. FIG. 17A is a schematic diagram illustrating the structure of the magnetic core 206 of the sixteenth application example, FIG. 17B is a schematic diagram illustrating the structure of the magnetic core 207 of the seventeenth application example, and FIG. 17C is a schematic diagram illustrating the structure of the magnetic core 208 of the eighteenth application example.

[Sixteenth Application Example]

As described above, the condition is that magnetic flux densities of any two points $L_H$ away from each other in the existence area approximate to each other. Therefore, as described with reference to FIG. 11, under the condition of $S \geq 2L_H$, a compensation relation is established even with regularity in a cycle of a wavelength $\lambda_B = L_H$ of the magnetic flux density distribution. As illustrated in FIG. 17A, the magnetic core 206 of the present application example is formed by arranging the first magnetic body 1, the second magnetic body 2, and the third magnetic body 3 in the section between the coordinates EE and CC to form a pattern with the wavelength $\lambda_B=L_H$ and repeatedly laminating this pattern.

[Seventeenth Application Example]

As with the sixteenth application example, the magnetic core 207 of the present application example is formed by arranging the first magnetic body 1, the second magnetic body 2, and the third magnetic body 3 in the section between the coordinates EE and CC to form a pattern with the wavelength $\lambda_B=L_H$ and repeatedly laminating this pattern. In the present application example, the first magnetic body 1 is formed so as to be thicker than other layers.

[Eighteenth Application Example]

The magnetic core 208 of the present application example is formed by arranging magnetic bodies of four types (the first magnetic body 1, the second magnetic body 2, the third magnetic body 3, and the fourth magnetic body 4) in the section between the coordinates EE and CC to form a pattern with the wavelength $\lambda_B=L_H$ and repeatedly laminating this pattern.

As such, according to the magnetic cores 200 to 208 of the current sensor of the present embodiment, as with the first embodiment, variations among products (among operations) of the current sensor can be suppressed, a current sensor with higher accuracy can be achieved, demerits of each material can be compensated for, and merits of each substance can be enjoyed.

[Third Embodiment]

A nineteenth application example to a twenty-fourth application example adoptable for a magnetic core of a current sensor of a third embodiment obtained by modifying the second embodiment are described below with reference to FIG. 18. FIG. 18 illustrates schematic diagrams illustrating application examples adoptable for the current sensor of the third embodiment. FIG. 18A to FIG. 18F are schematic diagrams illustrating the structures of the magnetic cores 300 to 305 from the nineteenth application example to the twenty-fourth application example, respectively.

As illustrated in FIG. 18, the section between the coordinates EE and CC, which is the sensing part existence area set in the second embodiment, can be extended to be an area where the entire magnetic core is included. With this, even if the sensing part existence area is unknown, a compensation relation is established under the condition of $S \geq 2L_H$ when the entire magnetic core is formed so as to have regularity at a cycle of the wavelength of $\lambda_B=L_H/m$ (where m is an integer equal to or larger than 1) of the magnetic flux density distribution, as described with reference to FIG. 11. Therefore, in the present embodiment, an area between the core left end part and the core right end part in the drawing is set as one between the coordinates EE and CC, and the thirteenth to eighteenth application examples of the second embodiment are modified to provide nineteenth to twenty-fourth application examples.

As such, according to the magnetic cores 300 to 305 of the current sensor of the present embodiment, in addition to the same effects as those of the first and second embodiments, even if the sensing part existence area is unknown, a compensation relation is established under the condition of $S \geq 2L_H$, and therefore variations among products (operations) of the current sensor can be suppressed.

<Magnetic Body>

From the first to third embodiments, the plurality of types of magnetic body are described as the first magnetic body 1 to the fourth magnetic body 4. Specifically, these magnetic bodies may be any of the soft magnetic materials described above, for example, iron, silicon steel, Permalloy, Sendust, Pennendur, soft ferrite (ferrite sheet), amorphous magnetic alloy (amorphous ribbon), nanocrystalline magnetic alloy, and electromagnetic steel (non-oriented steel plate and oriented steel plate). Examples of a suitable combination when two types of magnetic bodies are used for configuration include: an electromagnetic steel plate and a material with favorably frequency characteristic; ferrite and an oriented electromagnetic steel plate; an amorphous magnetic alloy and an oriented electromagnetic steel plate; and an amorphous magnetic alloy and ferrite.

<Non-Magnetic Body>

While the non-magnetic body 9 is described in the first to third embodiments, the non-magnetic body specifically means a diamagnet or paramagnet.

<In the case of $\lambda_B \neq L_H/m$ ($L_H \neq \lambda_B \times m$)>

Figure 19:
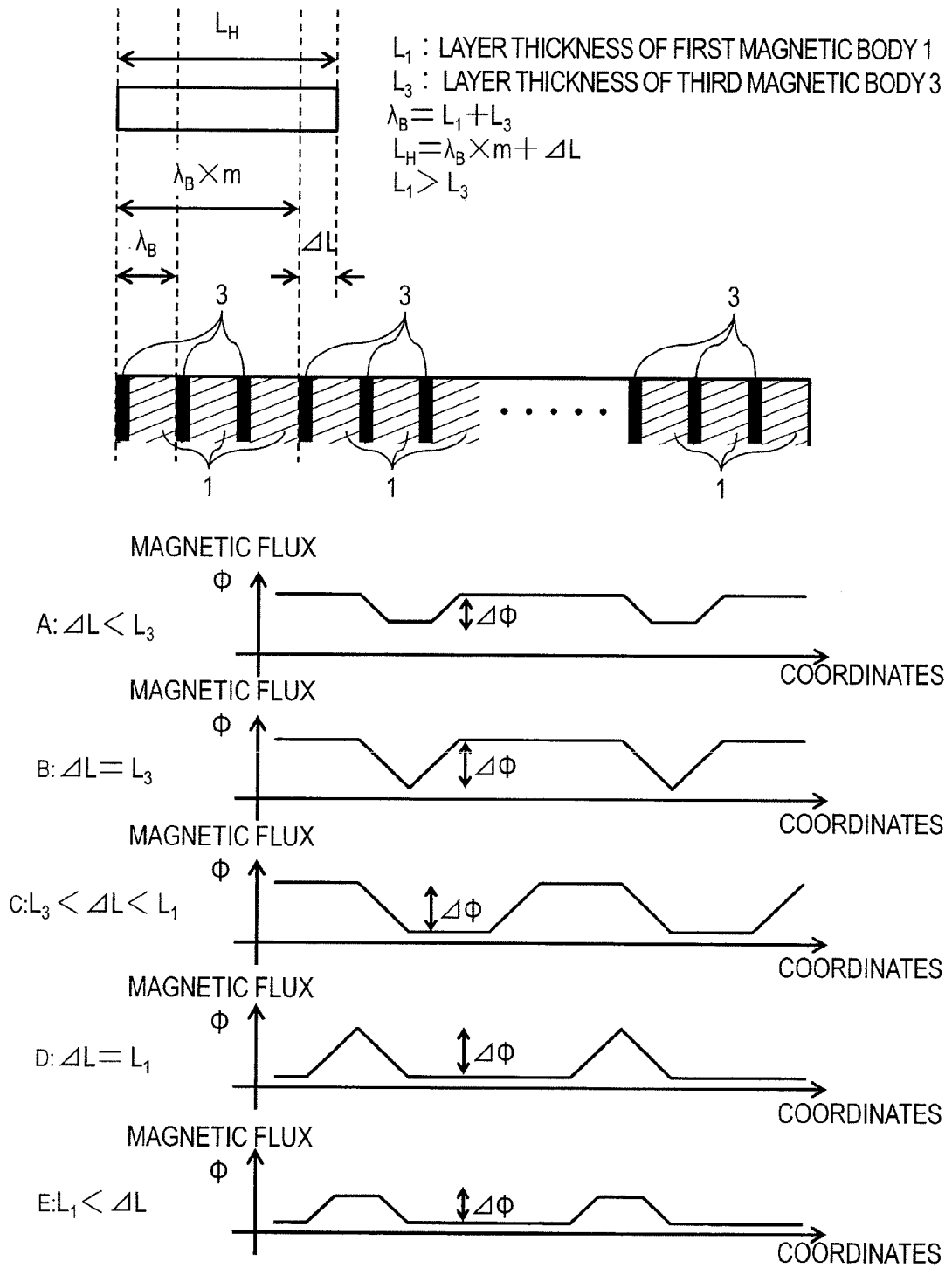
FIG. 19 is a diagram schematically illustrating changes in total number of magnetic fluxes when the length of the sensing part in a laminating direction is not an integral multiple of a cycle.

The case where a wavelength $\lambda_B=L_H/m$ ($L_H=\lambda_B \times m$) is not satisfied is discussed below with reference to FIG. 19. FIG. 19 is a diagram schematically illustrating changes in total number of magnetic fluxes when the length $L_H$ of the sensing part in a laminating direction is not an integral multiple of a wavelength $\lambda_B$.

Regarding the case of $L_H \neq \lambda_B \times m$, it is assumed that $L_H = \lambda_B \times m + \Delta L$ is satisfied where an excessive length of the Hall IC sensing part 11 is taken as $\Delta L$. FIG. 19 illustrates an example in which magnetic bodies of two types (the first magnetic body 1 and the third magnetic body 3) are alternately laminated to form a cyclic distribution. The layer thickness of the first magnetic body 1 is taken as $L_1$, and the layer thickness of the third magnetic body 3 is taken as $L_3$. In this example, it is assumed that $L_1 > L_3$. The above-described wavelength is $\lambda_B = L_1 + L_3$. Also, the magnetic permeability of the first magnetic body 1 is taken as $\mu_1$, and the magnetic permeability of the third magnetic body 3 is taken as $\mu_3$. In this example, it is assumed that $\mu_1 > \mu_3$. Here, consider each of the following cases: the case in which the excessive length $\Delta L$ is thinner than $L_3$, which is the thinner layer thickness (A: $\Delta L < L_3$); the case in which the excessive length $\Delta L$ is equal to $L_3$, which is the thinner layer thickness (B: $\Delta L = L_3$); the case in which the excessive length $\Delta L$ is thicker than $L_3$, which is the thinner layer thickness, and thinner than $L_1$, which is the thicker layer thickness (C: $L_3 < \Delta L < L_1$); the case in which the excessive length $\Delta L$ is equal to $L_1$, which is the thicker layer thickness (D: $\Delta L = L_1$); and the case in which the excessive length $\Delta L$ is thicker than $L_1$, which is the thicker layer thickness (E: $L_1 < \Delta L$).

<A: $\Delta L < L_3$>

In this case, a change $\Delta \Phi$ of the total number of magnetic fluxes of the Hall IC sensing part 11 is maximum between the case in which $\Delta L$ is included in a coordinate section where one layer of the first magnetic body 1 exists and the case in which $\Delta L$ is included in a coordinate section where one layer of the third magnetic body 3 exists. The calculation equation for $\Delta \Phi$ in this case is $\Delta \Phi = \Delta L \times W_H \times (\mu_1 - \mu_3) \times H$, where the strength of the magnetic field is H and the length of the Hall IC sensing part 11 in a direction orthogonal to the laminating direction and orthogonal to the circumferential direction of the core is $W_H$.

<B: $\Delta L = L_3$>

In this case, as with the pattern A, the change $\Delta \Phi$ of the total number of magnetic fluxes of the Hall IC sensing part 11 is maximum between the case in which $\Delta L$ is included in a coordinate section where one layer of the first magnetic body 1 exists and the case in which ΔL is included in a coordinate section where one layer of the third magnetic body 3 exists. However, since ΔL=L$_3$ in the pattern B, the calculation equation for ΔΦ in this case is ΔΦ=L$_3$×W$_H$×(μ$_1$−μ$_3$)×H, where ΔΦ is larger than that of the pattern A.

<C: L$_3$<ΔL<L$_1$>

In this case, the change ΔΦ of the total number of magnetic fluxes of the Hall IC sensing part 11 is maximum between the case in which ΔL is included in a coordinate section where one layer of the first magnetic body 1 exists and the case in which ΔL includes all the cases of coordinate section (length L$_3$) where one layer of the third magnetic body 3 exists. The calculation equation for ΔΦ is the same as that of the pattern B, ΔΦ=L$_3$×W$_H$×(μ$_1$−μ$_3$) 41, where ΔΦ is larger than that of the pattern A.

<D: ΔL=L$_1$>

In this case, as with the pattern C, the change ΔΦ of the total number of magnetic fluxes of the Hall IC sensing part 11 is maximum between the case in which ΔL is included in a coordinate section where one layer of the first magnetic body 1 exists and the case in which ΔL includes all coordinate sections (length L$_3$) where one layer of the third magnetic body 3 exists. The calculation equation for ΔΦ is the same as those of the patterns B and C, ΔΦ=L$_3$×W$_H$×(μ$_1$−μ$_3$)×H, where ΔΦ is larger than that of the pattern A.

<E: L$_1$<ΔL>

In this case, the change ΔΦ of the total number of magnetic fluxes of the Hall IC sensing part 11 is maximum between the case in which ΔL includes all coordinate sections (length L$_1$) where one layer of the first magnetic body 1 exists and the case in which ΔL includes all coordinate sections (length L$_3$) where one layer of the third magnetic body 3 exists. The calculation equation for ΔΦ is ΔΦ=(L$_1$+L$_3$−ΔL)×W$_H$×(μ$_1$−μ$_3$)×H, where ΔΦ is smaller than those of the patterns B, C, and D.

As considered above, even if L$_H$ is not precisely an integral multiple of the wavelength λ$_B$ to cause the excessive length ΔL, this poses no problem as long as ΔΦ is sufficiently small and deviation in sensitivity of the Hall element due to ΔΦ is approximately within a range of measurement errors allowable by the product. For example, the overall error of a vehicle-mount high-precision sensor for electric automobiles is on the order of 1%. Therefore, with an allowable value of errors occurring due to positional variations of the Hall element being taken on the order of one tenth of the overall error, the ratio of ΔΦ with respect to the total number of magnetic fluxes Φ is on the order of 0.1%. Here, consider the example of FIG. 19 and, so as to satisfy the formula below, $$\frac{\Delta\Phi}{\Phi} = \frac{L_3 \times W_H \times (\mu_1 - \mu_3) \times H}{m \times L_1 \times W_H \times \mu_1 \times H + m \times L_3 \times W_H \times \mu_3 \times H - L_3 \times W_H \times (\mu_1 - \mu_3) \times H} \quad (1)$$

$$= \frac{L_3 \times (\mu_1 - \mu_3)}{m \times L_1 \times \mu_1 + m \times L_3 \times \mu_3 - L_3 \times (\mu_1 - \mu_3)} \leq 0.001$$

materials are selected (settings of μ$_1$ and μ$_3$) and the layer thicknesses L$_1$ and L$_3$ of the materials are preferably determined. From the formula (1), it can be found that ΔΦ/Φ becomes smaller as L$_3$ becomes smaller than L$_1$ and μ$_1$ and μ$_3$ more approximate to each other.

<Shape and Laminating Direction of Magnetic Core of the Invention>

Figure 20A:
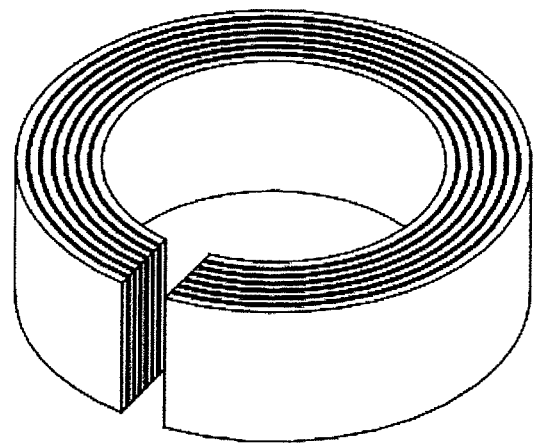
FIG. 20A is a perspective view of an example of a magnetic core in a ring shape with lamination in a concentric annular shape, which is a variation in shape and laminating direction of the magnetic core included in the current sensor of the present invention.
Figure 20B:
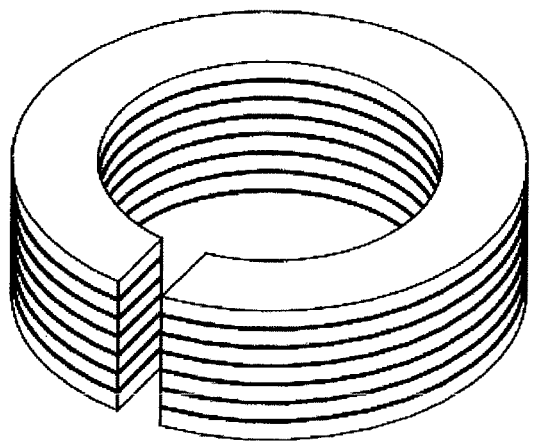
FIG. 20B is a perspective view of an example of a magnetic core in a ring shape with lamination in a current conducting direction, which is a variation in shape and laminating direction of the magnetic core included in the current sensor of the present invention.
Figure 20C:
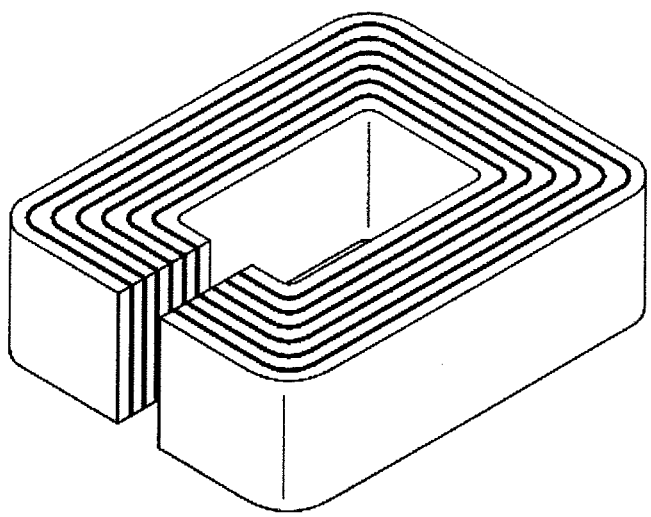
FIG. 20C is a perspective view of an example of a magnetic core in a substantially-angular C shape with lamination in a concentric annular shape, which is a variation in shape and laminating direction of the magnetic core included in the current sensor of the present invention.

The shape and the laminating direction of the magnetic core of the present invention are described with reference to FIG. 20. FIG. 20 is perspective views of variations of the shape and the laminating direction of the magnetic core included in the current sensor of the present invention. FIG. 20A illustrates an example of a magnetic core in a ring shape with lamination in a concentric annular shape, FIG. 20B illustrates an example of a magnetic core in a ring shape with lamination in a current conducting direction, and FIG. 20C illustrates an example of a magnetic core in a substantially-angular C shape with lamination in a concentric annular shape. While the shape of the magnetic core 100 (101 to 108, 200 to 208, 300 to 305) according to the embodiments is described with reference to FIG. 3 as being a shape formed by rolling a plate in an annular shape, the present invention is not restricted to this. For example, as illustrated in FIG. 20C, the shape may be a substantially-angular C shape. Also, as described above, the laminating direction may be any direction except the circumferential direction. Therefore, the magnetic core may be formed by lamination in a current conducting direction as illustrated in FIG. 20B.

<Magnetic Core Manufacturing Method>

Subsequently with reference to FIG. 20, a method of manufacturing the magnetic core of the present invention is described. In the case of a magnetic core of FIG. 20A, the magnetic core can be manufactured by laminating flat plates made of a plurality of materials to form a laminated plate and, after forming this laminated plate into a pipe, cutting out part of the circumference of the pipe to form a gap. This manufacturing process is easy, and the gap end face formed by cutting is uniform. Therefore, this is one of suitable manufacturing processes. Other than that, the magnetic core of FIG. 20A can be manufactured by rolling a laminated plate formed by laminating flat plates made of a plurality of materials into a C shape. With a similar manufacturing method, a magnetic core of FIG. 20C can be manufactured. Also, in the case of a magnetic core of FIG. 20B, the magnetic core can be manufactured by laminating flat plates made of a plurality of materials to form a laminated plate and, after punching this laminated plate into a ring shape, cutting out part of its circumference to form a gap. Other than that, regarding the magnetic core of FIG. 20B, after a plurality of different ring-shaped sheet materials are alternately laminated, part of the circumference may be cut out to form a gap.

DESCRIPTION OF REFERENCE NUMERALS

1 first magnetic body
2 second magnetic body
3 third magnetic body
4 fourth magnetic body
9 non-magnetic body
11 Hall IC (element) sensing part
11a outer-edge-direction end part
11b center-direction end part
11c upper-direction end part
11d lower-direction end part
13 lead wire
13c-1 flange part
15 Hall IC
15a end part
15b case
20 gap
30 hollow part 50 case
51 accommodating part
52 guide sleeve
53 stopper
54 current conductive part
55 bottom surface
60 lid
61 oblong recessed part
100 to 108, 200 to 208, 300 to 305 magnetic core

What is claimed is:

1. A current sensor comprising:
a magnetic core with a gap in part of a circumference and formed in an annular shape; and
a magneto-electric conversion element arranged in the gap, the magneto-electric conversion element detecting magnetic fluxes changing with a measurement target current passing through a hollow part of the magnetic core; wherein
the magnetic core
is formed by laminating a plurality of sheets of different materials in a direction except a circumferential direction, and
is formed so that magnetic flux densities of two points in a sensing part existence area defined in advance as an area where a sensing part of the magneto-electric conversion element exist approximate to each other, the two points being away from each other with a distance in a laminating direction being a length of the sensing part in the laminating direction.

2. The current sensor according to claim 1, wherein
a length S of the sensing part existence area in the laminating direction is smaller than twice the length $L_H$ of the sensing part in the laminating direction,
m is taken as an integer equal to or larger than 1, and
the magnetic core is formed so that a distribution of magnetic flux densities in the laminating direction in the sensing part existence area has regularity in a cycle of a length $(S-L_H)/m$.

3. The current sensor according to claim 1, wherein
a length S of the sensing part existence area in the laminating direction is equal to or larger than twice the length $L_H$ of the sensing part in the laminating direction,
m is taken as an integer equal to or larger than 1, and
the magnetic core is formed so that a distribution of magnetic flux densities in the laminating direction in the sensing part existence area has regularity in a cycle of a length $L_H/m$.

4. The current sensor according to claim 1, wherein
the magnetic core is formed by irregularly laminating the plurality of sheets of different materials.

5. The current sensor according to claim 1, wherein
the magnetic core is formed with lamination in a concentric annular shape.

6. The current sensor according to claim 1, wherein
the magnetic core is formed with lamination in a conducting direction of the measurement target current.

7. The current sensor according to claim 1, wherein
the magnetic core is formed by rolling a flat plate formed by laminating the plurality of sheets of different materials into an annular shape and cutting part of the circumference.

8. The current sensor according to claim 1, wherein
the magnetic core is formed by alternately laminating an oriented electromagnetic steel and an amorphous magnetic alloy.

9. The current sensor according to claim 1, wherein
the magnetic core is formed by alternately laminating an oriented electromagnetic steel and ferrite.

* * * * *